United States Patent
Dennison

(10) Patent No.: US 6,534,781 B2
(45) Date of Patent: Mar. 18, 2003

(54) PHASE-CHANGE MEMORY BIPOLAR ARRAY UTILIZING A SINGLE SHALLOW TRENCH ISOLATION FOR CREATING AN INDIVIDUAL ACTIVE AREA REGION FOR TWO MEMORY ARRAY ELEMENTS AND ONE BIPOLAR BASE CONTACT

(75) Inventor: Charles Dennison, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 09/749,126

(22) Filed: Dec. 26, 2000

(65) Prior Publication Data
US 2002/0079483 A1 Jun. 27, 2002

(51) Int. Cl.[7] .............................................. H01L 47/00
(52) U.S. Cl. ............................................. 257/5; 438/95
(58) Field of Search ............................ 257/2, 3, 4, 5; 365/163; 438/95

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 5,296,716 A | 3/1994 | Ovshinsky et al. |
| 5,789,758 A | 8/1998 | Reinberg |
| 5,854,102 A | 12/1998 | Gonzalez |
| 5,879,955 A | 3/1999 | Gonzalez et al. |
| 5,920,788 A | 7/1999 | Reinberg |
| 5,933,365 A | 8/1999 | Klersy et al. |
| 5,970,336 A | 10/1999 | Wolstenholme et al. |
| 5,970,374 A | 10/1999 | Teo |
| 5,998,244 A | 12/1999 | Wolstenholme et al. |
| 6,002,140 A | 12/1999 | Gonzalez et al. |
| 6,025,220 A | 2/2000 | Sandhu |
| 6,031,287 A | 2/2000 | Harshfield |
| 6,085,341 A | 7/2000 | Greason et al. |
| 6,087,674 A | 7/2000 | Ovshinsky et al. |
| 6,141,241 A | 10/2000 | Ovshinsky |
| 6,153,890 A | 11/2000 | Wolstenholme et al. |
| 6,165,836 A | 12/2000 | Forbes et al. |
| 6,189,582 B1 | 2/2001 | Reinberg |
| 6,229,157 B1 | 5/2001 | Sandhu |
| 6,339,544 B1 * | 1/2002 | Chiang et al. ............... 365/163 |

* cited by examiner

*Primary Examiner*—Tom Thomas
*Assistant Examiner*—Thien F Tran
(74) *Attorney, Agent, or Firm*—Trop, Pruner & Hu, P.C.

(57) ABSTRACT

The invention relates to a process of forming a phase-change memory device. The process includes forming a salicide structure in peripheral logic portion of the substrate and preventing forming salicide structures in the memory array. The device may include a double-wide trench into which a single film is deposited but two isolated lower electrodes are formed therefrom. Additionally a diode stack is formed that communicates to the lower electrode.

8 Claims, 21 Drawing Sheets

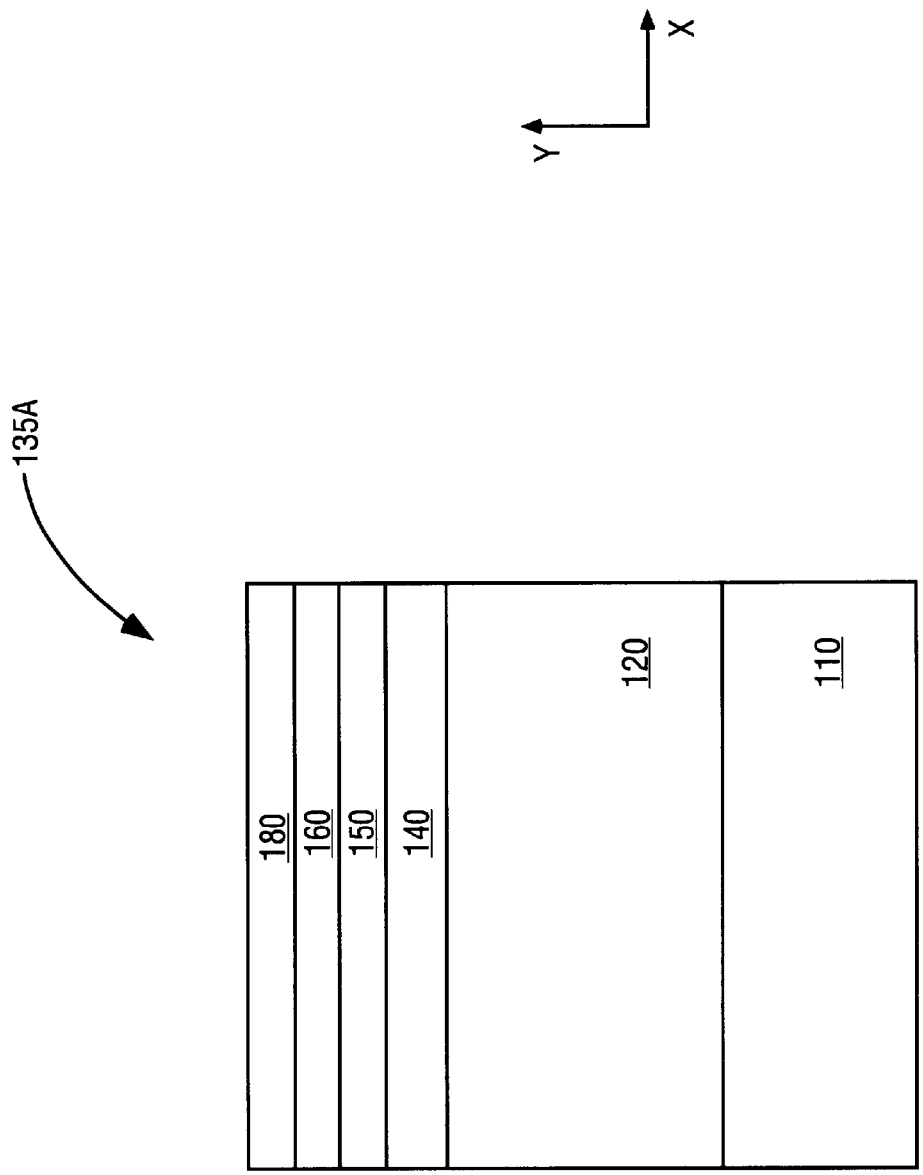

PHASE-CHANGE MEMORY BIPOLAR ARRAY UTILIZING A SINGLE SHALLOW TRENCH ISOLATION FOR CREATING AN INDIVIDUAL ACTIVE AREA REGION FOR TWO MEMORY ARRAY ELEMENTS AND ONE BIPOLAR BASE CONTACT

BACKGROUND OF THE INVENTION

1. Field of the Invention

The present invention relates to a phase-change memory device. More particularly, the present invention relates to formation of a silicide-free active area in the memory device.

2. Description of Related Art

As microelectronic technology progresses, the need has arisen for new data retention schemes. One such data retention scheme is the chalcogenide phase-change technology that eliminates the charge leakage problem such as in capacitative dynamic random access memory (DRAM). Typically, a phase-change memory device includes a polysilicon lower electrode, also known as a "matchstick".

One challenge of forming a lower electrode in a phase-change memory cell is to shrink the cell size while still being able to dope the polysilicon matchstick structure in an ever-increasing aspect ratio recess. As the aspect ratio of the recess increases, it becomes increasingly difficult to properly dope the matchstick structure for at least two reasons. First, an increasingly steep angle of implantation directed at the polysilicon wall will result in an increasingly higher incidence of ricochet of the dopants instead of implantation. Second, as that aspect ratio gets higher, it becomes increasingly difficult to get dopant to strike the polysilicon wall at the bottom of the recess; an inadequate doping at the bottom results in a conductive failure.

Another challenge of forming a lower electrode in a phase-change memory cell is to shrink the cell size while not increasing capacitive coupling between a given memory cell and a contiguous memory cell.

Another process challenge is the singulation of the lower electrode film in order to achieve discrete conductive electrodes without decreasing process yield. Typically, a masking and etching operation is carried out that etches away polysilicon that will not be located within a given memory cell footprint.

Another challenge for a phase-change memory device is power consumption required in setting and resetting memory material. Power consumption is significant, particularly in portable devices such as a hand-held or wireless device.

Another challenge is to form embedded phase-change DRAM without uneconomically increasing processing and without increasing processing complexity.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 8 shows the cross-section of the structure of FIG. 4 through line A–A';

DETAILED DESCRIPTION OF THE INVENTION

The invention relates to a memory device that is used with phase-change material to memorialize data storage. The device uses a lower electrode material that is referred to as a "matchstick". Beneath the matchstick, an active area that may be a diode stack is provided to activate the lower electrode. The active area is free of silicide structures. A second isolation trench may be formed or a virtual diode stack may be formed. The lower electrode is formed over the diode stack portion of the memory cell structure, and a volume of phase change memory material is disposed above the matchstick. Either a high resistivity metal compound may be used as the lower electrode, or a polysilicon compound may be used.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
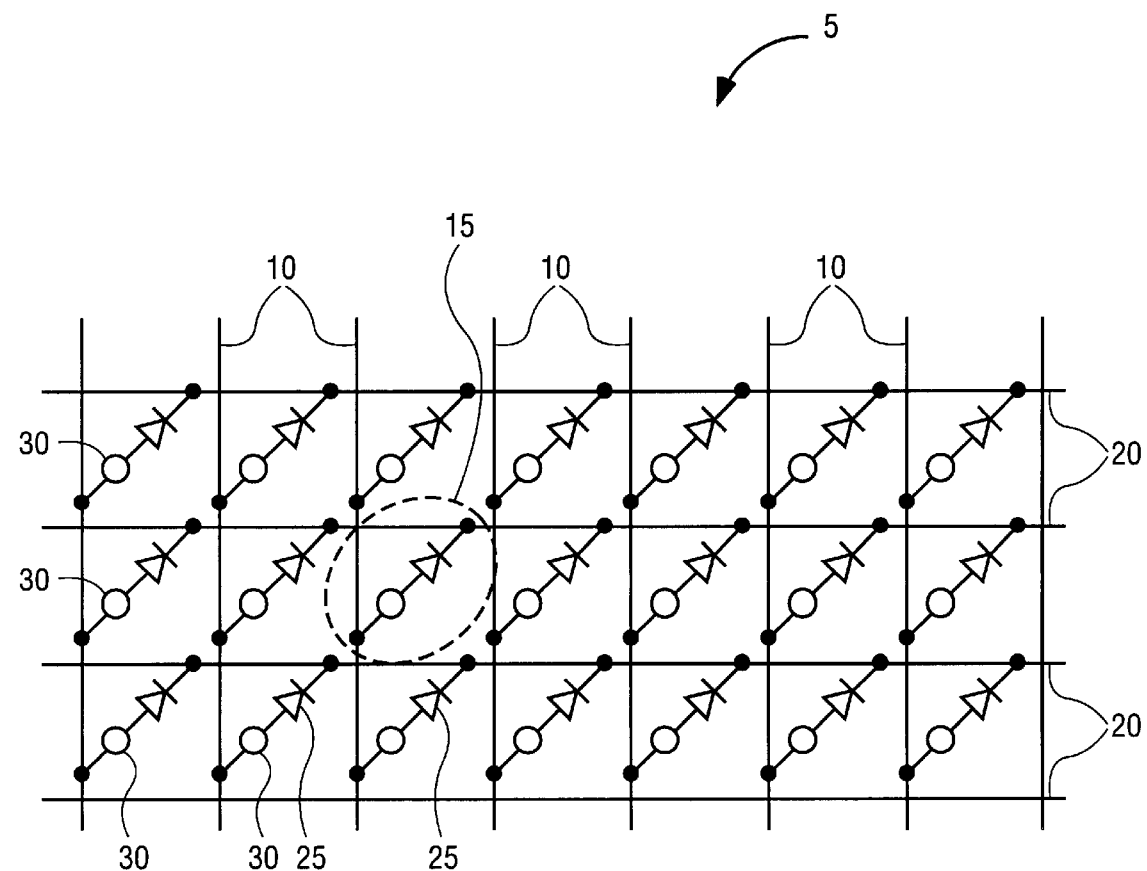
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

Figure 2:
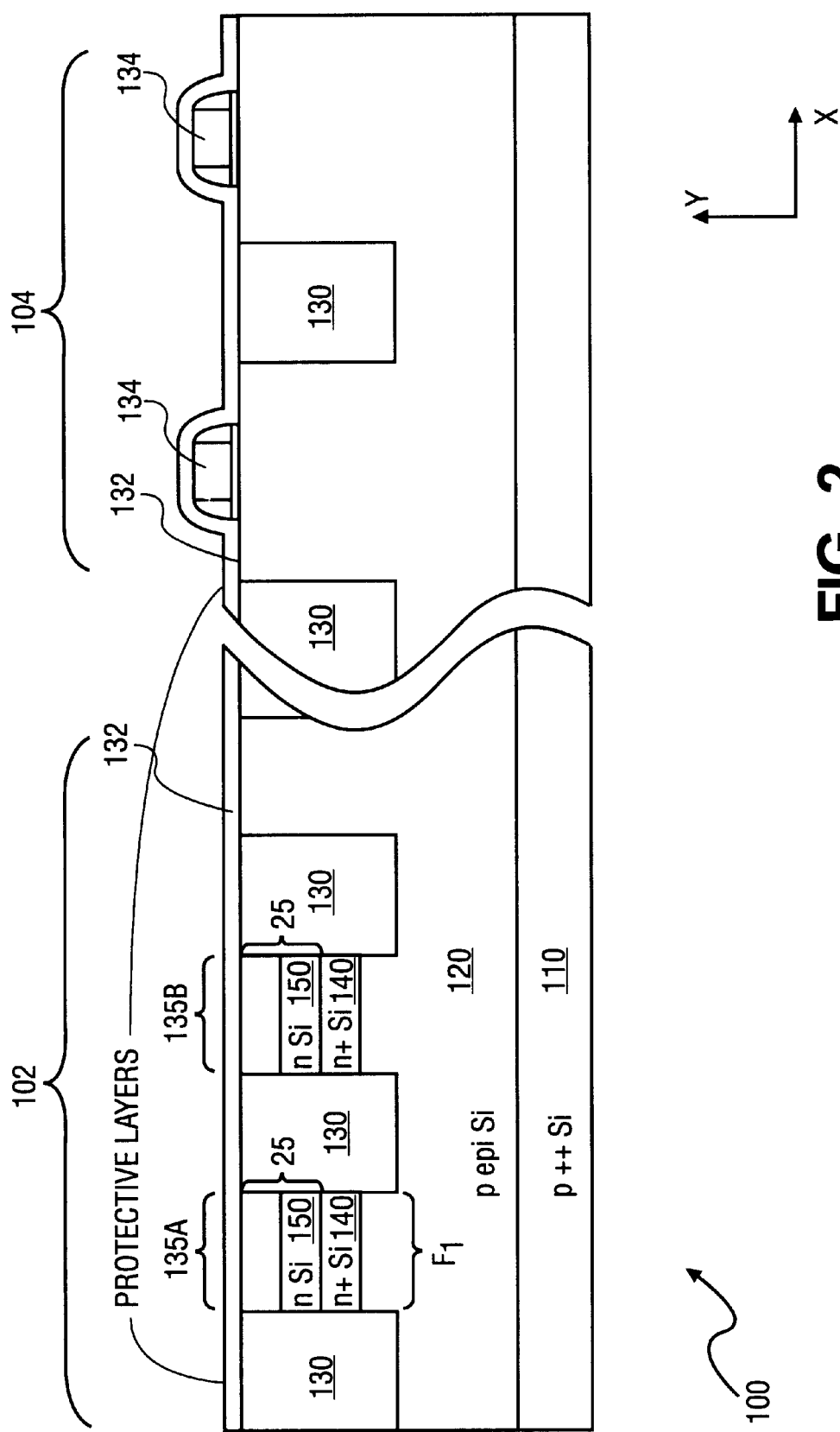
FIG. 2 schematically illustrates a cross-sectional planar side view of a portion of a semiconductor substrate that includes a memory array and peripheral logic structures that may have chip logic, such as for embedded memory.

FIGS. 2–19 illustrate the fabrication of representative memory element 15 of FIG. 1 according to various embodiments. FIG. 2 shows a portion of substrate 100 that is, for example, a semiconductor substrate. In this example, a P-type dopant such as boron is introduced into deep portion 110 of the memory array 102. No specific doping is indicated in the peripheral logic 104, but a doping process may be required according to a given application. In one example for memory array 102, a suitable concentration of P-type dopant is on the order of above $5\times10^{19}$–$1\times10^{20}$ atoms per cubic centimeters (atoms/cm$^3$) rendering deep portion 110 of substrate 100 representatively P$^{++}$. Overlying deep portion 110 of substrate 100, in this example, is an epitaxial portion 120 of P-type epitaxial silicon. In one example, the dopant concentration in epitaxial portion 120 is on the order of about $10^{16}$–$10^{17}$ atoms/cm$^3$. The introduction and formation of epitaxial portion 120 as P-type, and deep portion 110 as a P++ type portion may follow techniques known to those of skill in the art.

FIG. 2 also shows a shallow trench isolation (STI) structures 130 formed in epitaxial portion 120 of substrate 100. As will become apparent in the subsequent discussion, STI structures 130 serve, in one aspect, to define the z-direction thickness of a memory cell structure diode stack, with at this point only the z-direction thickness of a memory element cell defined. A minimum feature, F, may be defined as a minimum geometry that defines the memory cell. Additionally, a first minimum feature, $F_1$ may be defined.

In another aspect, first STI structures 130 serve to isolate individual memory elements in one dimension, from one another as well as associated circuit elements such as transistor devices formed in and on substrate 100. First STI structures 130 also appear in the peripheral logic 104 portion of substrate 100, in this embodiment to assist in formation of complementary metal oxide silicon (CMOS) devices with embedded phase-change memory. First STI structures 130 are formed according to techniques known to those skilled in the art.

In the memory array portion 102 of substrate 100, a plurality of what may be called precursor diode stacks is prepared to form memory cell regions 135A and 135B. Memory cell regions 135A and 135B may be referred to as first and second areas, respectively, or as first and second active areas, respectively. In one embodiment, memory cell regions 135A and 135B are introduced as strips with the x-direction dimension thereof greater than the z-direction dimension. Overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18}$–$10^{19}$ atoms/cm$^3$ such as N$^+$ silicon. In this example, first conductor or signal line material 140 serves as an address line, a row line such as row line 20 of FIG. 1. Overlying first conductor or signal line material 140 is what will eventually become an isolation device 25 such as isolation device 25 of FIG. 1. In one example, isolation device 25 is a PN diode formed of N-type silicon portion 150 that may have a dopant concentration on the order of about $10^{17}$–$10^{18}$ atoms/cm$^3$. Later in the inventive process, a P-type silicon portion will be formed above N-type silicon portion 150 to complete the diode stack of isolation device 25. The P-type silicon portion will be a self-aligned portion as will be disclosed herein below. The P-type silicon portion may have a dopant concentration on the order of about $10^{19}$–$10^{20}$ atoms/cm$^3$. Although the precursor of a future PN isolation device 25 is shown, it is to be appreciated that other isolation structures are similarly suitable. Such isolation devices include, but are not limited to, MOS devices.

A dielectric layer 132 overlies both memory array 102 and gate stacks 134 in peripheral logic 104. Dielectric layer 132 acts to protect portions of substrate 100 during fabrication of the inventive device. Dielectric layer 132 is a deposited oxide in one embodiment such as tetra ethyl ortho silicate (TEOS) or the like. In this embodiment, dielectric layer 132 has a thickness in a range from about 5 nm to about 20 nm, and preferably about 10 nm to about 15 nm.

Figure 3:
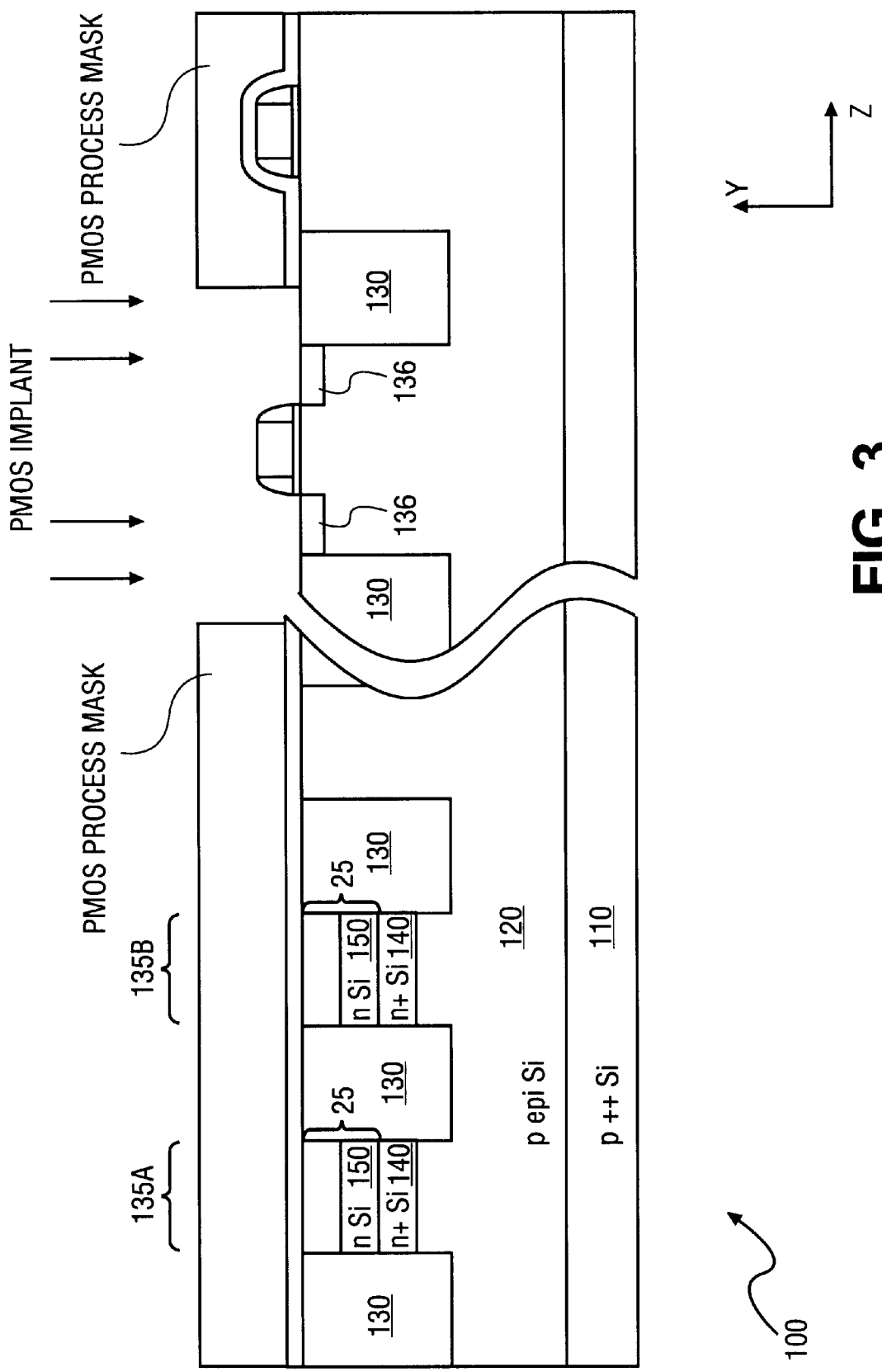
FIG. 3 shows the structure of FIG. 2, through the same cross-sectional view, after the introduction of dopants in the peripheral logic structures, while protecting the memory array and other portions of the peripheral logic structures.

FIG. 3 shows the structure of FIG. 2 after patterning for a P-doping metal oxide silicon (PMOS) process, and PMOS implanting into substrate 100. Dielectric layer 132 may be removed from substrate 100 by a dilute HF dip as is known in the art. P-doped channels 136 are formed in substrate 100 for a first portion of a CMOS structure.

Figure 4:
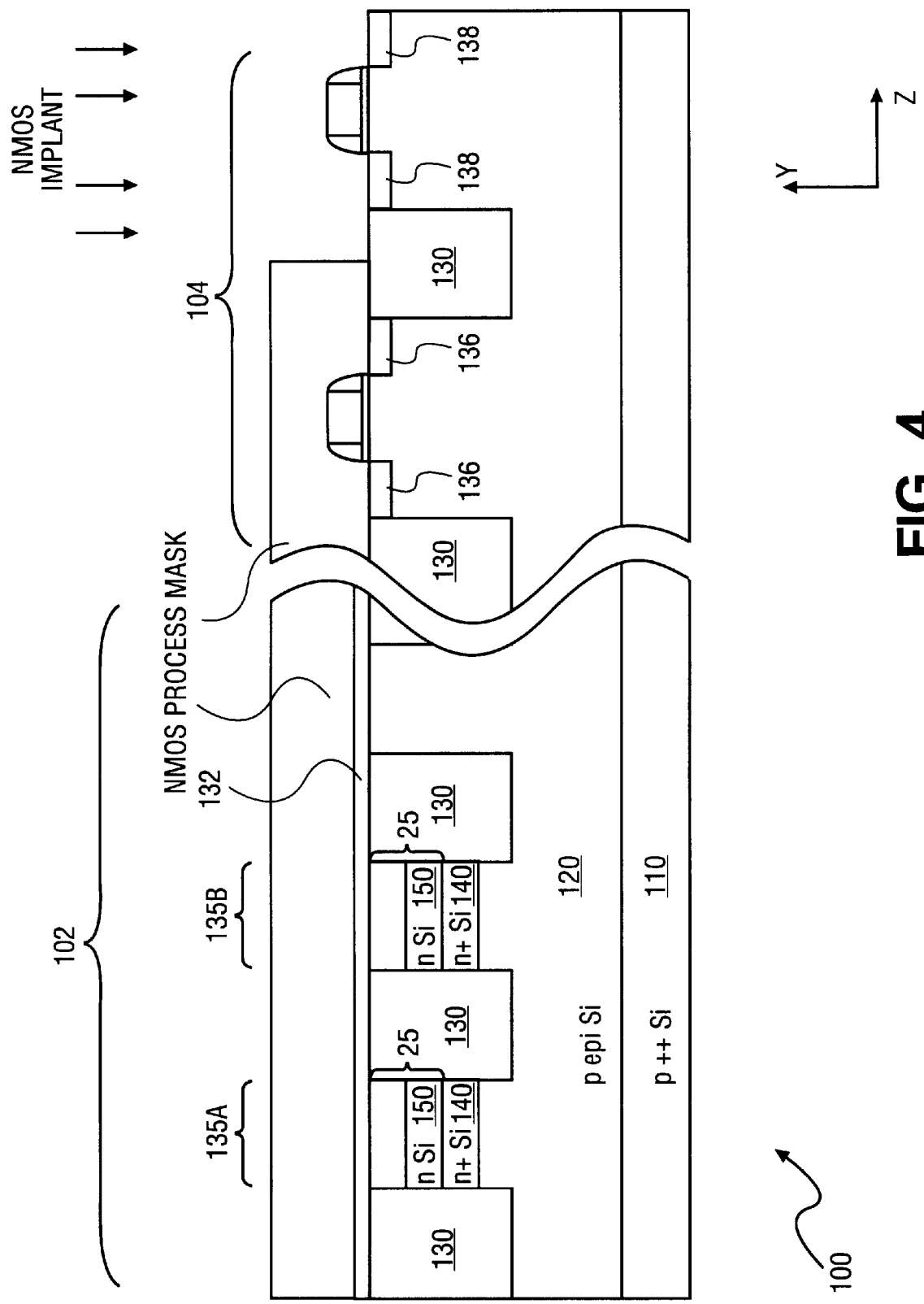
FIG. 4 shows the structure of FIG. 3, through the same cross-sectional view, after the introduction of dopants in another section in the peripheral logic structures, while protecting the memory array and other portions of the peripheral logic structures to form CMOS doping.

FIG. 4 shows the structure of FIG. 3 after patterning for an N-doping process (NMOS) and NMOS implanting into substrate 100. Again, dielectric layer 132 that is exposed in the NMOS patterning may be removed from substrate 100 by a dilute HF dip as is known in the art. N-doped channels 138 are formed in substrate 100 for a second or complementary portion of a CMOS structure. Accordingly, the peripheral portion 104 of substrate contains logic structures and the like, and memory array portion 102 has been protected both by PMOS and NMOS masks and by dielectric layer 132.

Figure 5:
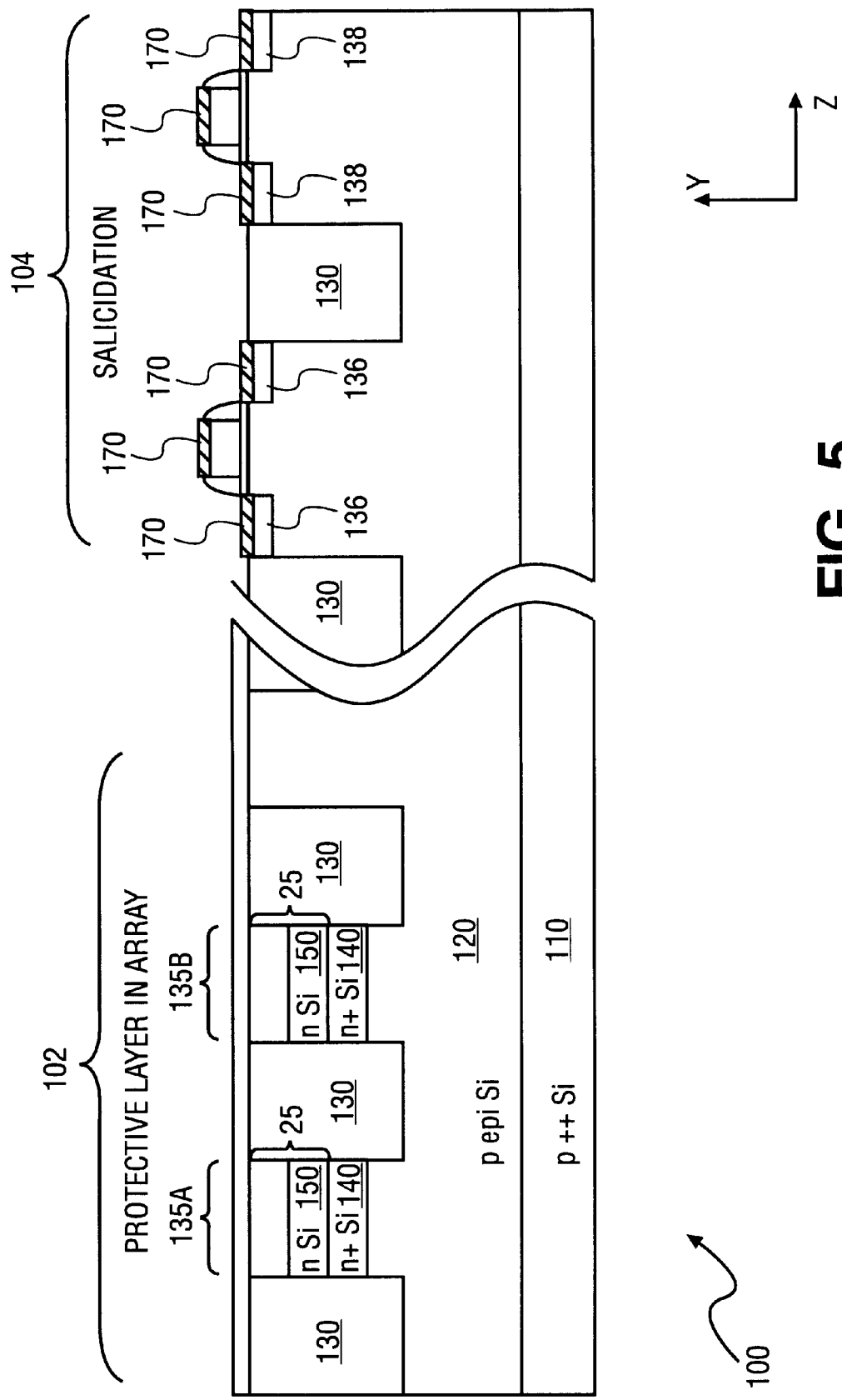
FIG. 5 illustrates the structure of FIG. 4 after a completed self-aligned silicidation process in the peripheral logic structures.

FIG. 5 illustrates the structure of FIG. 4 after further processing in which self-aligned silicidation (salicidation) is carried out in the peripheral portion 104 of substrate 100. By retaining dielectric layer 132 in memory array portion 102 of substrate, salicidation is blocked out according to the present invention. In FIG. 5, a salicide reducer material 170 is depicted in both the NMOS and PMOS portions of peripheral portion 104 of substrate, while the presence of dielectric layer 132 in memory array portion 102 has prevented any salicide formation. Typically, reducer material 170 is cobalt silicide (CoSi$_2$) or a silicide of another refractory metal or refractory metal alloy such as titanium silicide, tungsten silicide, nickel silicide, tantalum silicide, and the like. When reducer material 170 is a metal silicide, it may be formed in place as a salicide. Reducer material 170 may be formed at this portion of the process or it may be formed later. Reducer material 170, in one aspect, serves as a low resistance material in the fabrication of peripheral circuitry such as addressing circuitry of the circuit structure on substrate 100. Thus, reducer material 170 may not be required in terms of forming a memory element as described.

Figure 6:
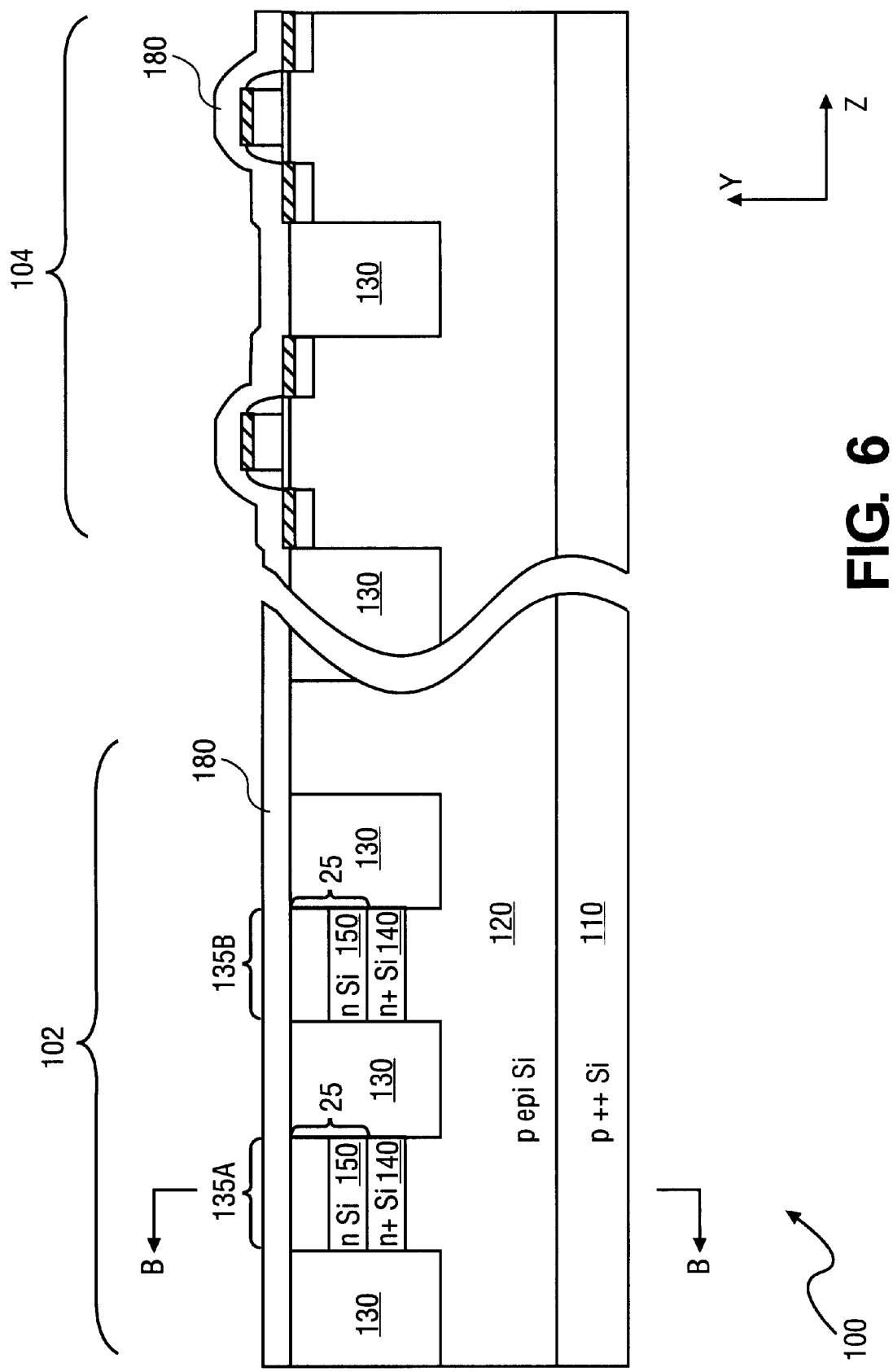
FIG. 6 illustrates the structure of FIG. 5 after the formation of a protective layer over the semiconductor substrate; the protective layer may act as a mask in the memory array and/or as an etch stop for the entire semiconductor substrate.

FIG. 6 illustrates further processing of substrate 100 wherein a masking material 180 is formed after the removal of dielectric layer 132 from memory array portion 102. As will be described herein, masking material 180 may serve as patterning to protect memory cell regions 135A and 135B as well as to protect portions of first STI structures 130 for a subsequent etch operation. In one embodiment, masking material 180 may not be patterned in either memory array portion 102 or peripheral portion 104, rather, masking material 180 may be blanket deposited to act in a double-etch process for accessing the silicon portions of substrate 100. In another embodiment, masking material 180 may be patterned in memory array portion 102 to further isolate memory cell regions 135A and 135B. Such patterning is depicted in this disclosure.

Figure 7:
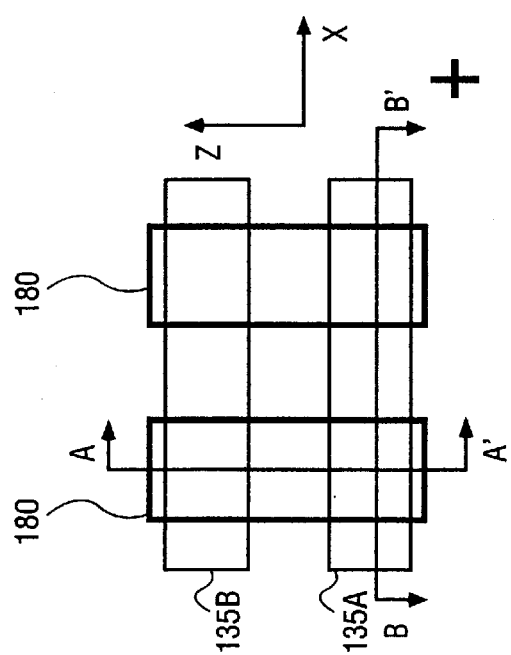
FIG. 7 shows a schematic top view of the memory array portion of the structure of FIG. 6.

FIG. 7 schematically shows memory cell regions 135A and 135B in an xz plane. Overlying the memory cell is masking material 180 as it has been patterned to further isolate memory cell regions 135A and 135B. FIG. 8 shows a cross-sectional side view of memory cell region 135A through line B–B' of FIG. 6 in an xy perspective. In one embodiment, a suitable material for masking material 180 is a dielectric material such as silicon nitride (Si$_3$N$_4$) or the like.

Figure 9:
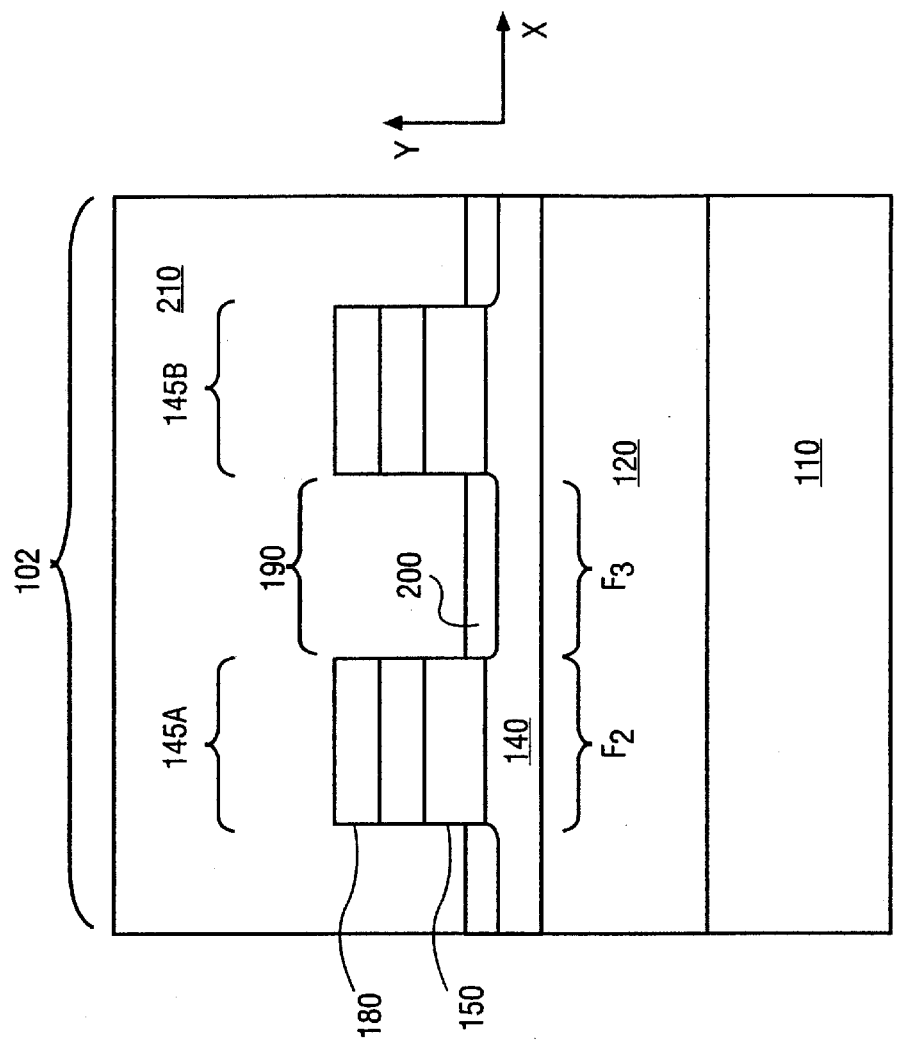
FIG. 9 shows the structure of FIG. 8, through the same cross-sectional view, after the patterning of the x-direction thickness of the semiconductor substrate structure and the formation of dielectric materials.

FIG. 9 shows the structure of FIG. 6 from an xy perspective through the line B–B' after patterning of the x-direction thickness of the memory cell material to form a second trench 190 (which is in contrast to first isolation structure 130 that is disposed in a first trench). FIG. 9 shows two memory cells 145A and 145B patterned from memory cell region 135A depicted in FIG. 6. The feature size of the memory cells, F$_2$ as measured in the s-direction may be equal to F1 as measured in the z-direction. Accordingly, a third feature, F$_3$, may define second trench in the x-direction.

The memory cells 145A and 145B may be referred to as first and third areas, respectively, or as first and third active areas, respectively. In one embodiment, the active areas, so designated, may be diode stacks. It is understood that first area 135A and first area 145A are the same. The patterning may be accomplished using conventional techniques for etching, in this example, refractory metal silicide and silicon material to the exclusion of masking material 180. The definition of the x-direction thickness involves, in one embodiment, an etch to conductive material 150 (N-type silicon in this embodiment) of the memory line stack to define memory cells 145A and 145B of memory cell region 135A. In the case of an etch, the etch proceeds through the memory line stack to, in this example, a portion of a conductor or signal line that is in this case conductive material 150. A timed etch may be utilized to stop an etch near this depth.

Following the patterning and etching of second trench 190, N-type dopant may be introduced at the base of each second trench 190 to form pockets 200 having a dopant concentration on the order of about $10^{18}$–$10^{20}$ atoms/cm$^3$ to form an N$^+$ region between memory cells 145A and 145B. Pockets 200 serve, in one sense, to maintain continuity of a row line. Because the memory cell structure 134 may be isolated by orthogonal trenches, the likelihood of cross talk between adjacent memory cell structures is reduced.

Optionally, a second dielectric structure may fill second trench 190, followed by planarization and the formation of dielectric materials 210. Another advantage to the this embodiment is that trench depths may be on the order from about 3,000 Å to about 7,000 Å and second trench 190 may have a total depth in a range range from about 500 Å to about 3,500 Å. Trench depths are limited by etch time constraints. Another advantage is that the a four-feature squared, 4F$^2$ configuration is easily scalable and a simplifying portion to integrate with design rules as geometries continue to reduce, for example from 0.35 μM, 0.25 μM, 0.18 μM, 0.13 μM, 0.11 μM, etc.

As an alternative to processing, prior to the formation of first STI structure 130 and/or following the formation of second trench 190, a thermal dielectric film (not pictured) may be formed in the respective trench(es). The thermal dielectric film(s) acts to assist with fill of the trenches with dielectric fill materials. Dielectric materials 210 are formed over the active areas 145A and 145B and to fill the trenches 190. With patterning of masking material 180 a minimum-feature memory cell may be formed.

Figure 10:
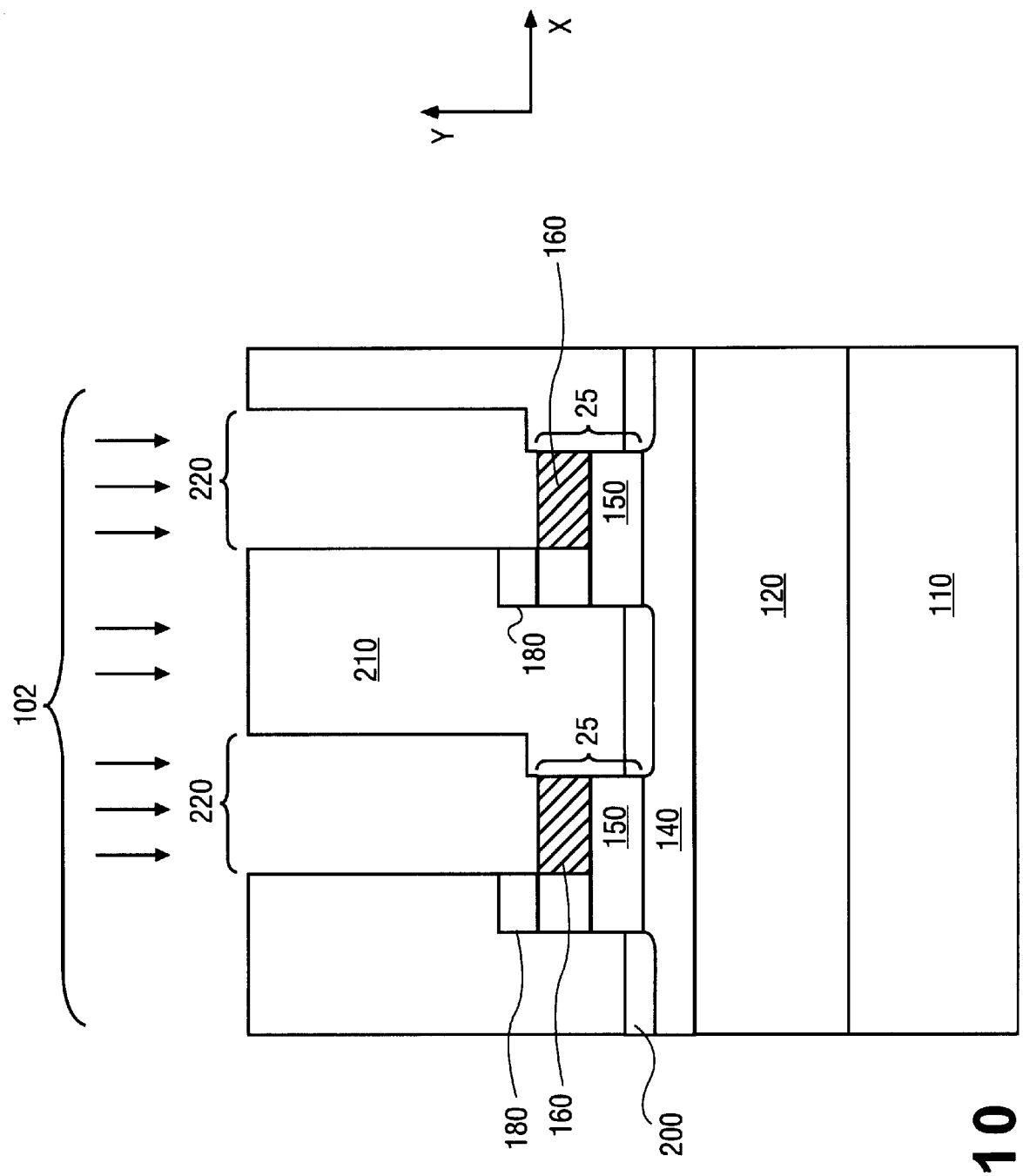
FIG. 10 shows the structure of FIG. 9 after further processing to form a recess that communicates to the semiconductive substrate, after self-aligned P+ doping to complete the diode stack.

FIG. 10 shows the structure of FIG. 9 after planarization of dielectric materials 210. Thereafter, formation of a recess 220 through dielectric materials 210 is accomplished to expose the active areas. A self-aligned P+ implantation 160 is carried out to complete the isolation device 25. As set forth above, the P-type silicon portion may have a dopant concentration on the order of about $10^{19}$–$10^{20}$ atoms/cm$^3$. The formation of recess 220 may be accomplished using etch patterning with an etchant(s) for etching dielectric material 210 in a rapid first etch and for etching masking material 180 in a slower second etch that resists over etching into the silicon. Etch recipes may be chosen that are selective to silicon and that tend to etch silicon oxides and silicon nitrides, to etch dielectric materials 210 and masking material 180, respectively. Recess 220 may be a rectangular trench or a circular contact hole.

Figure 10A:
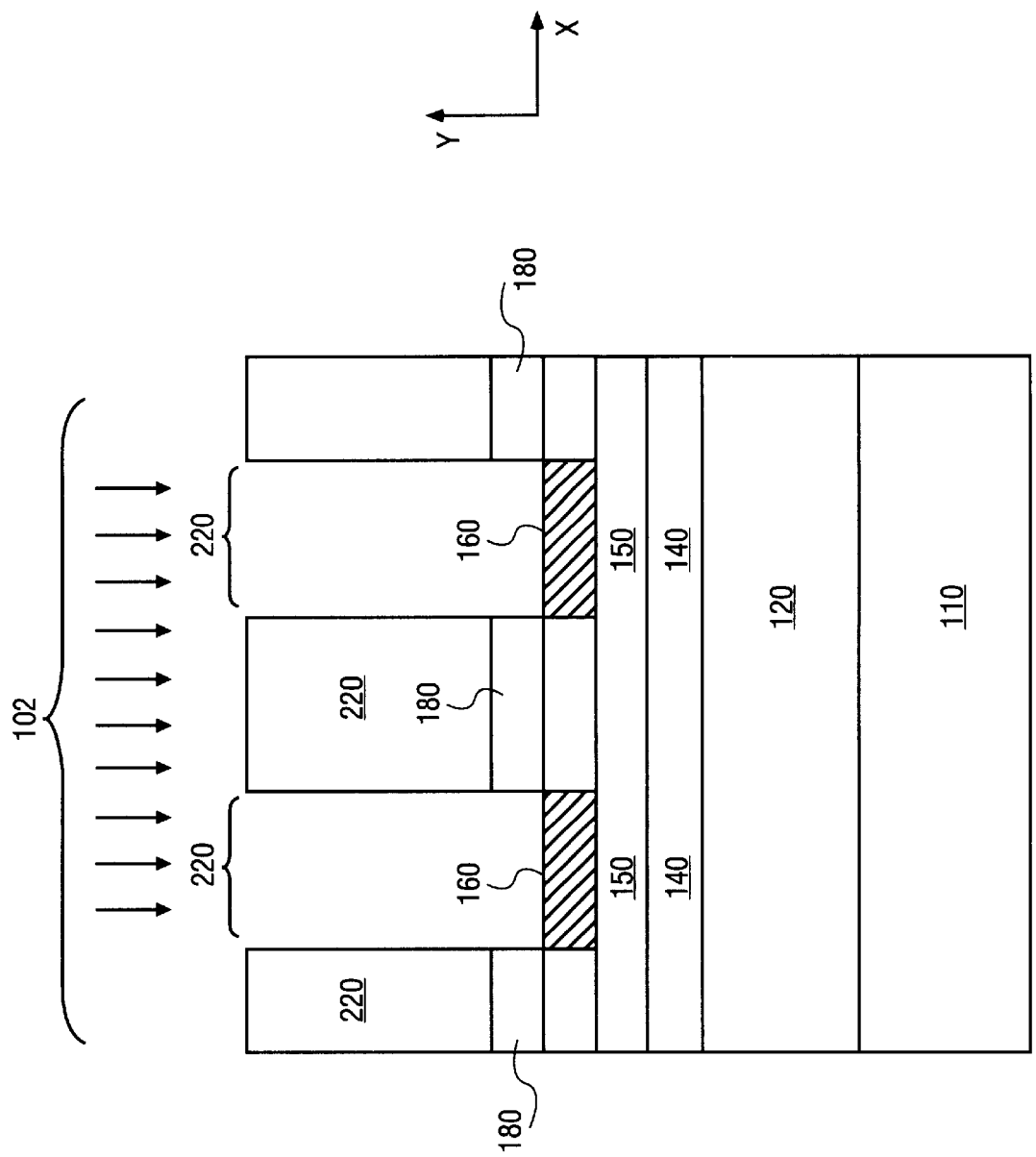
FIG. 10a illustrates alternative processing where the diode stack is a virtual stack in that orthogonal feature definition is not etched, but self-aligned P+ doping completes the diode.

FIG. 10a illustrates alternative processing of the structure depicted in FIG. 6 where no second trench 190 is formed. Mask 180 is not patterned over memory array portion 102, but acts as an etch stop for exposing the diode stack precursor in a rapid first etch through dielectric materials 210, and a slower second etch through masking material 180 as set forth herein. With no patterning of masking material 180, recess 220 is used for the self-aligned P+ implantation to achieve a virtual diode stack with P+ implantation 160 and N-type silicon portion 150 acting as the diode junction. Thus, second feature, $F_2$ is not formed in this embodiment.

Figure 11:
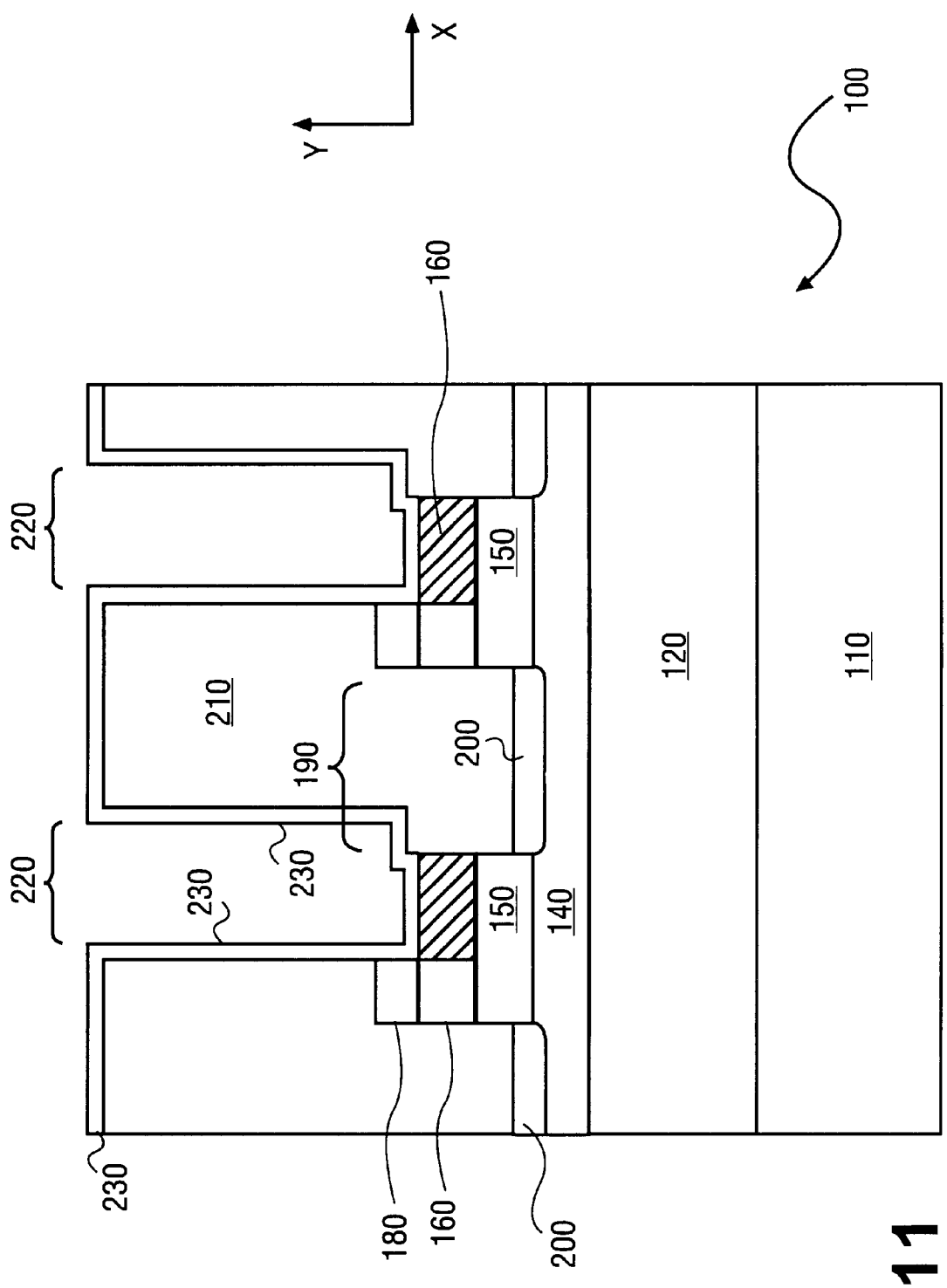
FIG. 11 shows the structure of FIG. 10 after the formation of a lower electrode layer.

FIG. 11 illustrates the formation of a conductive film 230 in recess 220 for the structure depicted in FIG. 10. Although trench 190 has been formed and is depicted in this disclosure, it is understood that other embodiments of the invention may be carried out without the presence of trench 190 with only selective doping carried out to form virtual diode stacks as depicted in FIG. 10a.

In one embodiment, the conductive film is a polysilicon film 230. The conformal introduction of polysilicon film 230 that is, for example, polycrystalline silicon may follow conventional introduction techniques known to those skilled in the art including chemical vapor deposition (CVD) techniques.

Figure 12:
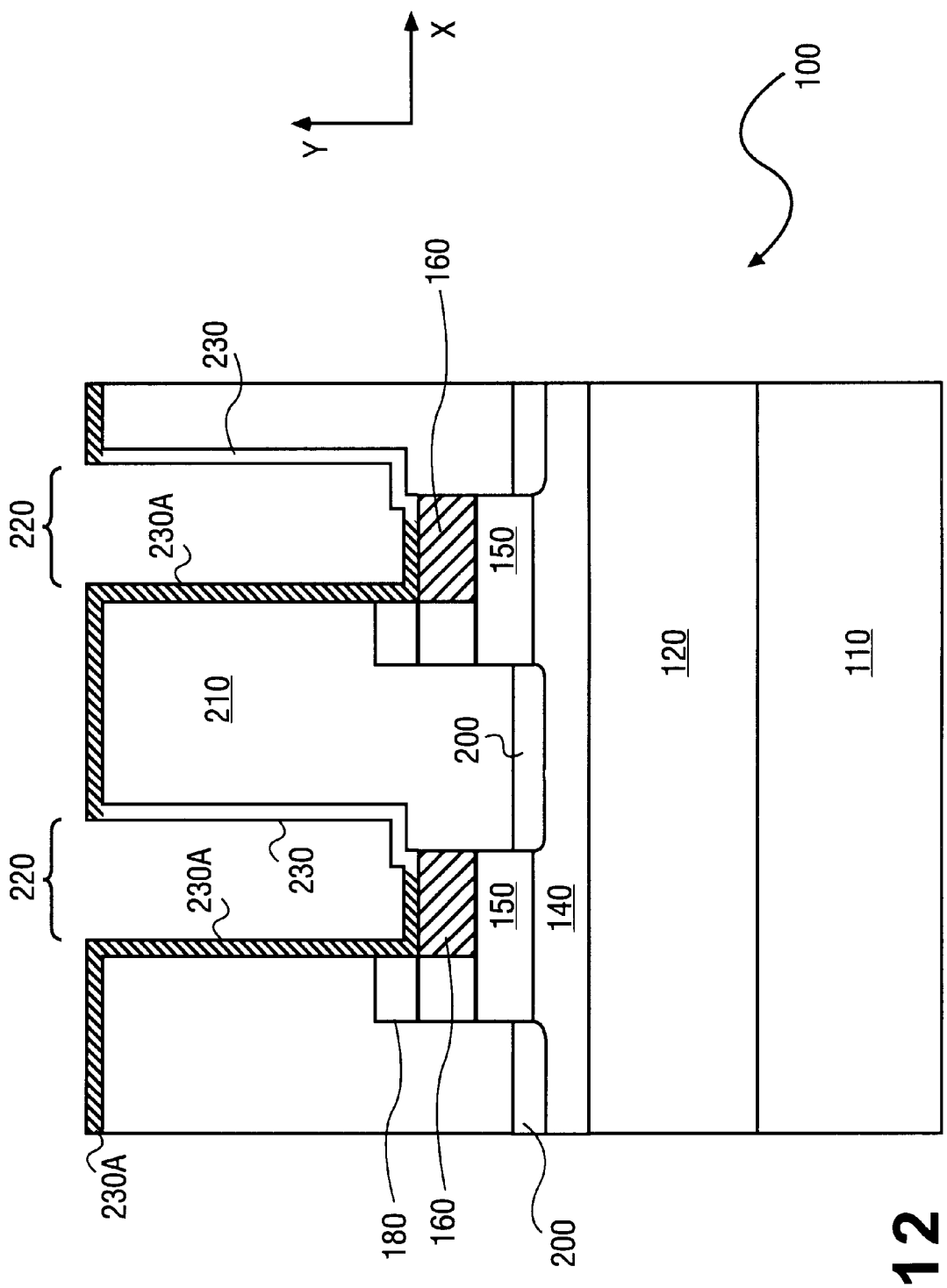
FIG. 12 shows the structure of FIG. 11 during angled doping that leaves a portion of the lower electrode material undoped.

Following the formation of recess 220 in the substrate 100, and following forming the polysilicon film 230, polysilicon film 230 is treated to further prepare the memory device. As depicted in FIG. 12, a suitable dopant is a P-typed dopant such as boron introduced to a concentration on the order of about $10^{19}$–$10^{20}$ atoms/cm$^3$. Because intrinsic polysilicon is an insulator, the introduction of a dopant such as a P-type dopant, followed by thermal activation, makes polysilicon film 230A an electrical conductor as illustrated in FIG. 12. The angle of implantation is preferably in the range from about 15 to 75 degrees. In any event, the angle of implantation is sufficient to implant in the sidewalls along recess 220, and to reach the bottom of recess 220 where polysilicon film 230 is in contact with the self-aligned doped portion 160 of the diode stack.

After doping, a first degree of conductivity of polysilicon film 230 exists where doping did not substantially occur, and a second degree of conductivity of the implanted polysilicon film 230A exists where doping did substantially occur.

Figure 13:
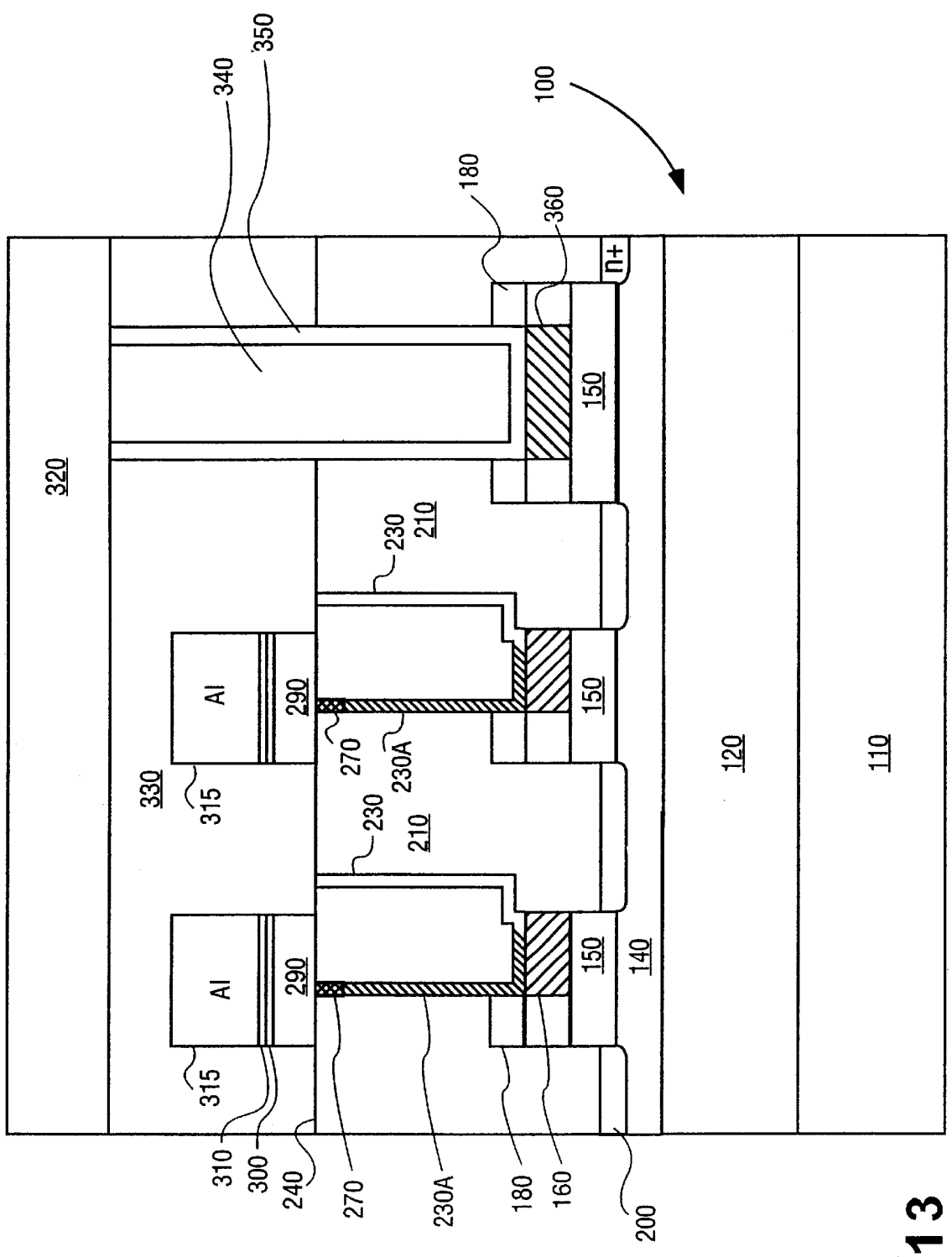
FIG. 13 shows the structure of FIG. 12 extensive further processing that illustrates the self-aligned N+ doping of the semiconductive substrate at the bottom of a contact via in preparation to form a contact for two phase-change memory cells.

FIG. 13 illustrates the substrate 100 after extensive further processing. After implanting polysilicon film 230A and thermal activation to form a lower electrode 230A, recess 220 is filled with a second dielectric 250. Second dielectric 250 may be formed by chemical vapor deposition of a silicon-containing substance selected from silicon oxide such a tetra ethyl ortho silicate (TEOS) process and the like.

Figure 19:
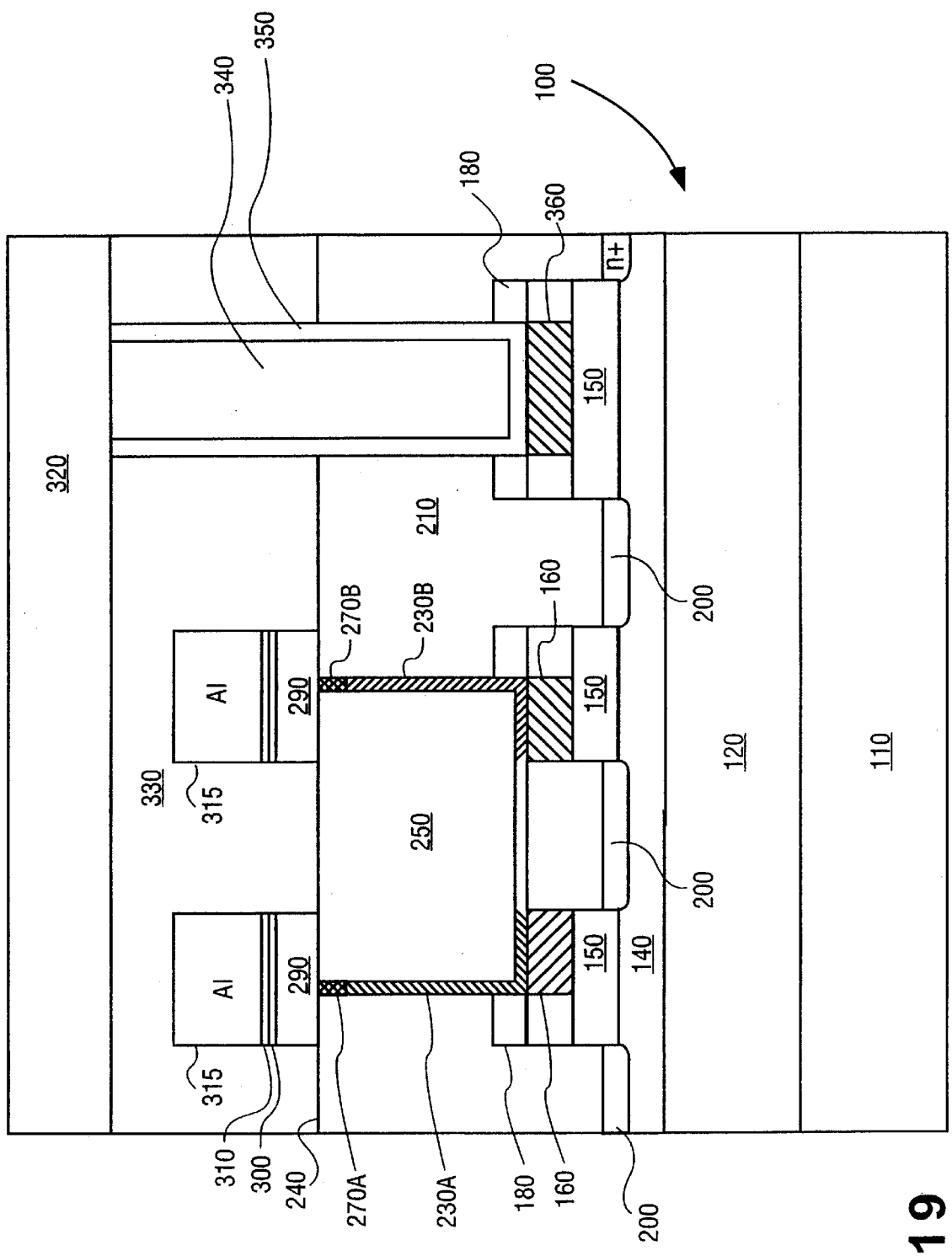
FIG. 19 is an elevational cross-section view of the structure in FIG. 16 after extensive further processing that illustrates the self-aligned N+ doping of the semiconductive substrate in preparation to form a contact for two phase-change memory cells.

Following the formation of second dielectric 250, all material that resides above a future top level 240 of recess 220 is removed as illustrated in FIG. 19. Removal of material may be accomplished by processes such as chemical mechanical planarization (CMP), mechanical planarization, and the like. Removal of material may be accomplished by processes such as isotropic etchback, anisotropic etchback, and the like. Removal of material may also be accomplished by a combination of CMP and etchback.

A modifying species may be introduced into lower electrode 230A that may be a chemical modifier that combines or reacts with lower electrode 230A to form a different material. In the example where lower electrode 230A and is polycrystalline silicon, the modifying species is introduced near the upper surface 240 in lower electrode 230A. The modifying species may include a chemical agent that reacts or combines with silicon to increase resistivity thereof. Suitable modifiers include, but are not limited to, carbon that reacts or combines with silicon to produce silicon carbide (SiC), oxygen to form $SiO_2$ or nitrogen to form $Si_3N_4$ or $SiN_xO_y$. Where the modifying species is TiN, suitable modifiers include, but are not limited to, oxygen, to form $TiN_xO_y$. An electrode material of SiC or $SiO_2$ generally has a higher resistivity than doped polycrystalline silicon of lower electrode 230A. Suitable materials also include those materials that are introduced (e.g., added, reacted, or combined) into lower electrode 230A and raise the resistivity value within the electrode (e.g., raise the local resistance near a volume of memory material), and the resistivity value is also stable at high temperatures. One measure of stability is a material's thermal coefficient of resistivity (TCR). A TCR represents a change in resistance of a material with a change in temperature. In general, semiconductor materials tend to have large negative TCRs. Polycrystalline silicon and semiconductors in general tend to significantly change their resistivity value in response to positive temperature. At high temperatures (e.g., 600 to 1200° C. or more), the resistivity of these materials decreases due to the generation of intrinsic charge carriers. Such materials may also experience thermal runaway relating to a material's stability at high temperatures. Materials with large negative TCRs may experience thermal runaway which can lead to inhomogeneous current patterns in an electrode. Thus, in one aspect, the modifying species is selected such that, when added, reacted, or combined with electrode material 230A, the TCR has a lower variation to positive temperature change, so that the resistivity at temperatures of 600° C. or more is stable. Lightly doped polycrystalline silicon has a larger negative TCR than more heavily doped polycrystalline silicon. While the heavily doped polycrystalline is suitable, at high temperatures (e.g., greater than 600° C.), the resistance is primarily determined by the silicon, not the dopants. Polycrystalline silicon with SiC or $SiO_2$ introduced, for example, yields an electrode material having a portion with a more stable TCR at high temperatures than polycrystalline silicon alone, likely the result of the wider conduction band associated with SiC or $SiO_2$.

In one embodiment, the modifying species is introduced into lower electrode 230A by implantation. In one example, modifying species 260 is carbon. Carbon dioxide ($CO_2$) is introduced into an implant chamber and fractured by a plasma into species including oxygen, carbon, and carbon monoxide. With an appropriate extraction potential, the species may be directed out of the chamber where they are separated generally in terms of the species' mass/charge ratio. In this manner, the desired species may be introduced (e.g., oxygen or carbon) into lower electrode 230A. In one example, oxygen is implanted at a dose of $10^{14}$–$10^{17}$ ions per square centimeter to form a concentration of a modified electrode material 270 in the lower electrode 230A on the order of about $10^{19}$–$10^{23}$ atoms/cm$^3$.

Figure 20:
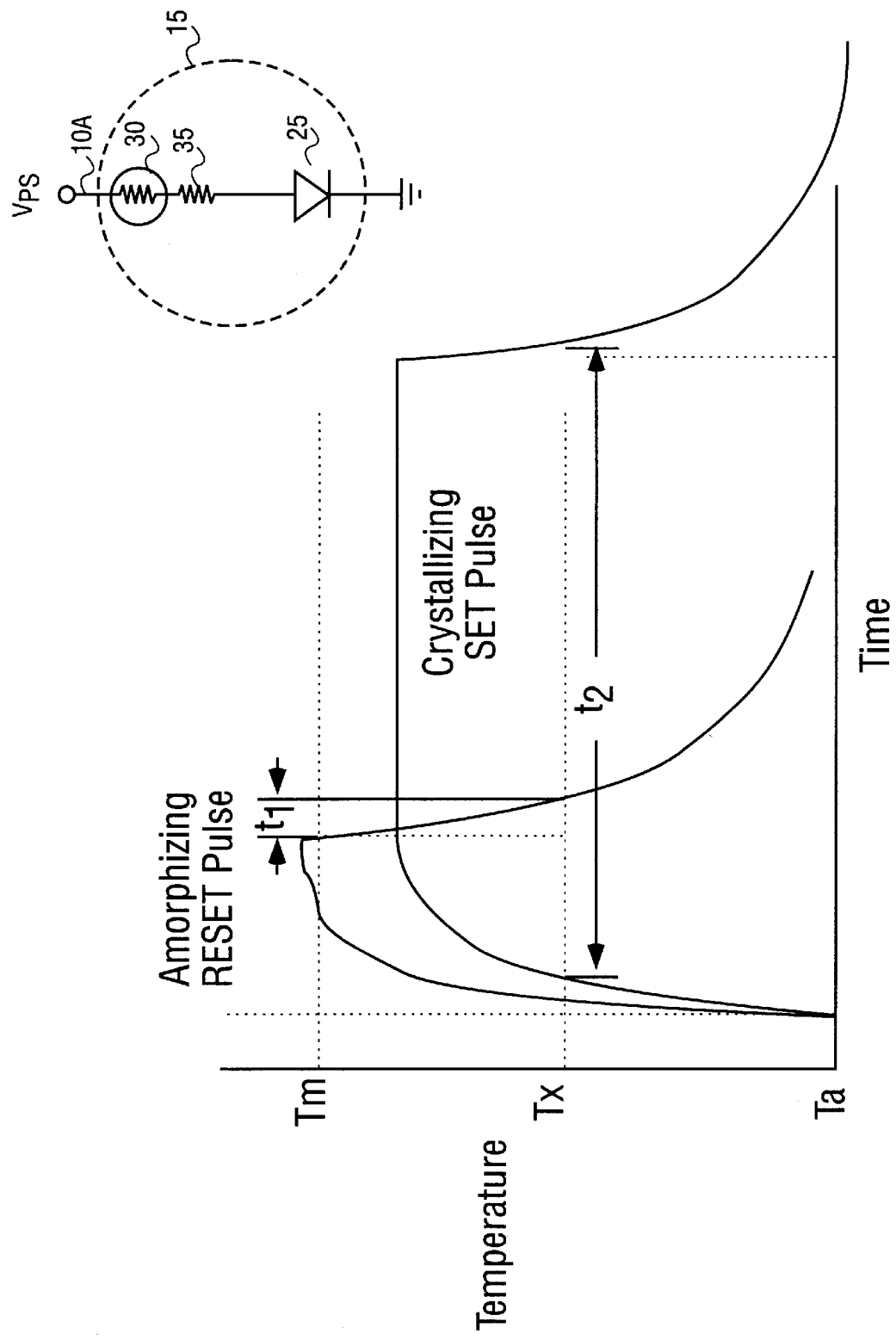
FIG. 20 shows a graphical representation of setting and resetting a volume of a phase change memory material in terms of temperature and time.

Referring to FIG. 13, a modifying species is introduced into lower electrode 230A to form a modified electrode material 270. FIG. 20 shows the structure having an electrode of two different material portions: lower electrode 230A (e.g., doped polycrystalline silicon) and modified electrode material 270 (e.g., polycrystalline silicon and SiC, SiO$_2$, etc.). Modified electrode material 270 is introduced into a portion of the electrode adjacent the exposed surface of the electrode at and near upper level 240. Modified electrode material 270 is selected to have a TCR with little or no change with positive temperature change so that at programming temperatures of 600° C. or more, the resistivity of modified electrode material 270 does not decrease to a value lower than a resistivity at a reduced non-programming temperature. In one example, modified electrode material 270 has a resistivity, $R_1$, that is higher than a resistivity, $R_2$, of lower electrode 230A at temperatures greater than 600° C. or at least has a thermal coefficient of resistivity that has a lower variation to positive temperature change. A modifying species of oxygen, carbon, or nitrogen when introduced into polycrystalline silicon to form modified electrode material 270 has shown a reduced TCR compared to polycrystalline silicon, with modified electrode material 270 having a greater resistivity, $R_1$, at 600° C. to 650° C. than lower electrode 230A of polycrystalline silicon.

The amount/depth of modified electrode material 270 generally depends on the amount of voltage that will be used to set or reset a volume of memory material. Using voltages in the range of about 3.3 volts (V) according to current technology, a suitable depth for modified electrode material 270 of, for example, SiC or SiO$_2$, into a polycrystalline silicon electrode is approximately 600 angstroms (Å). At lower voltages, a shorter depth would be suitable. In terms of amount of modified electrode material 270, amounts of 0.1 to 20 atomic percent of the modifying species are suitable, 0.5 to 10 percent are preferred, and 0.5 to five percent are more preferred.

As described above, modified electrode material 270 will be substantially adjacent to a volume of memory material. Because, in the embodiment described, modified electrode material 270 is of a higher resistivity, the material may not provide sufficiently suitable ohmic contact between the electrode and the volume memory material for a desired application. In such cases, modifying material may be introduced into the electrode at a depth below the exposed surface of the electrode at or near top level 240. In the example described, an electrode of polycrystalline silicon may have polycrystalline silicon at the exposed surface and modified electrode material 270 at a depth below the exposed surface but not throughout or adjacent for the exposed surface (e.g., 200–1000 Å below the exposed surface). Suitable implantation energies may be formulated to establish the depth of modified electrode material 270. In one example, a second introduction (e.g., deposition and doping) may also be employed to follow the introduction of a modifying species (to further change modified electrode material 270) and locate polycrystalline silicon adjacent the exposed surface of the electrode.

FIG. 13 shows the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material in both stoichiometric and solid-solution ratios. The volume of memory material 290, in one example according to current technology, is introduced and patterned with a thickness on the order of about 600 Å.

Overlying the volume of memory material 290 in the structure of FIG. 13 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

FIG. 13 also shows the introduction of dielectric material 330 over second conductor or signal line material 315. Dielectric material 330 is, for example, SiO$_2$ or other suitable material that surrounds second conductor or signal line material 315 and memory material 290 to electronically isolate such structure. In viewing the inventive structure, dielectric materials 210 may be referred to as a first dielectric layer 210 and dielectric material 330 may be referred to as a second dielectric layer 330. Following introduction, dielectric material 330 is planarized and a via is formed in a portion of the structure through dielectric material 330, dielectric material 210, and masking material 180 to a contact surface. The via may be formed in a two-part etch as set forth herein. The contact surface is then doped in a self-aligned N-type process to form an N-type base 360. N-type base 360 may be at the same level as the P-type emitter that is the self-aligned doped portion 160 of the diode stack. In concert, N-type base 360 acts as a base and self-aligned doped portion 160 acts as an emitter.

Figure 13A:
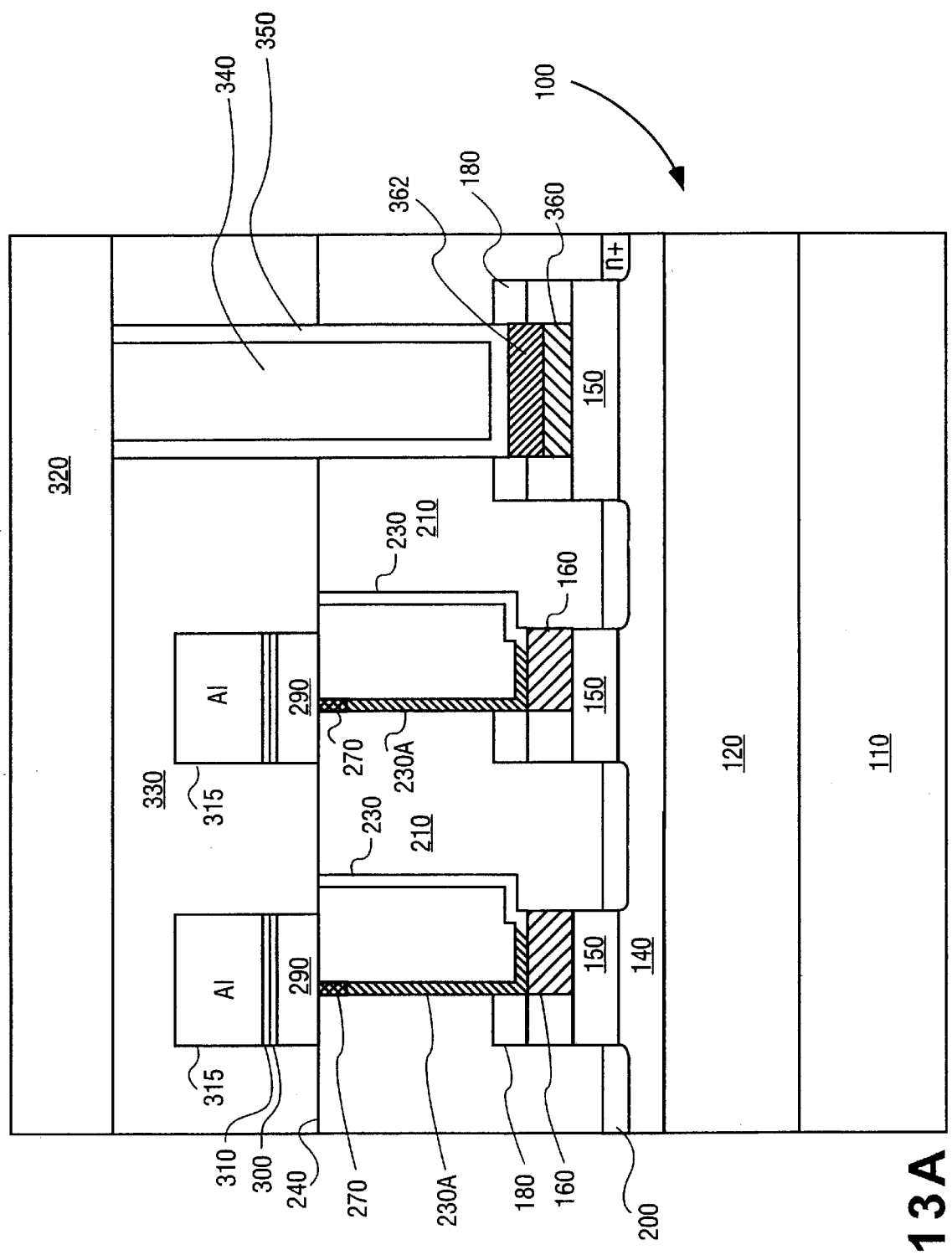
FIG. 13a shows the structure of FIG. 12 in a process alternative to depicted in FIG. 13.

Alternatively, one embodiment of the present invention relates to a salicide base structure at the bottom of the via, but no salicide structures at the diode stack emitters. FIG. 13a illustrates an alternative process in which, after a self-aligned N+ implantation 360 of the base region at the bottom of the via, a salicidation process is carried out to form an N+ salicide base structure 362.

After the formation of N+ implantation 360 and the optional N+ salicide base structure 362, the via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 13 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through the conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as aluminum or an aluminum alloy.

In the above description of forming a memory element such as memory element 15 in FIG. 1, lower electrode 230A is an electrode and is described between a memory material and conductors or signal lines (e.g., row lines and column lines) that has improved electrical characteristics. In the embodiment described, the resistivity of the lower electrode 230A is reduced as set forth herein. In this manner, a supplied voltage from second conductor or signal line material 320 or first conductor or signal line material 140 to the memory material 290 may be near the volume of memory material 290 and dissipation of energy to cause a phase change may be minimized. The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

In another embodiment, the inventive process may be applied to the formation of the conductive film in the recess in a manner that spans two diode stacks in one direction, and at least two diode stacks in an orthogonal direction. The recess may be referred to as a double wide.

Figure 14:
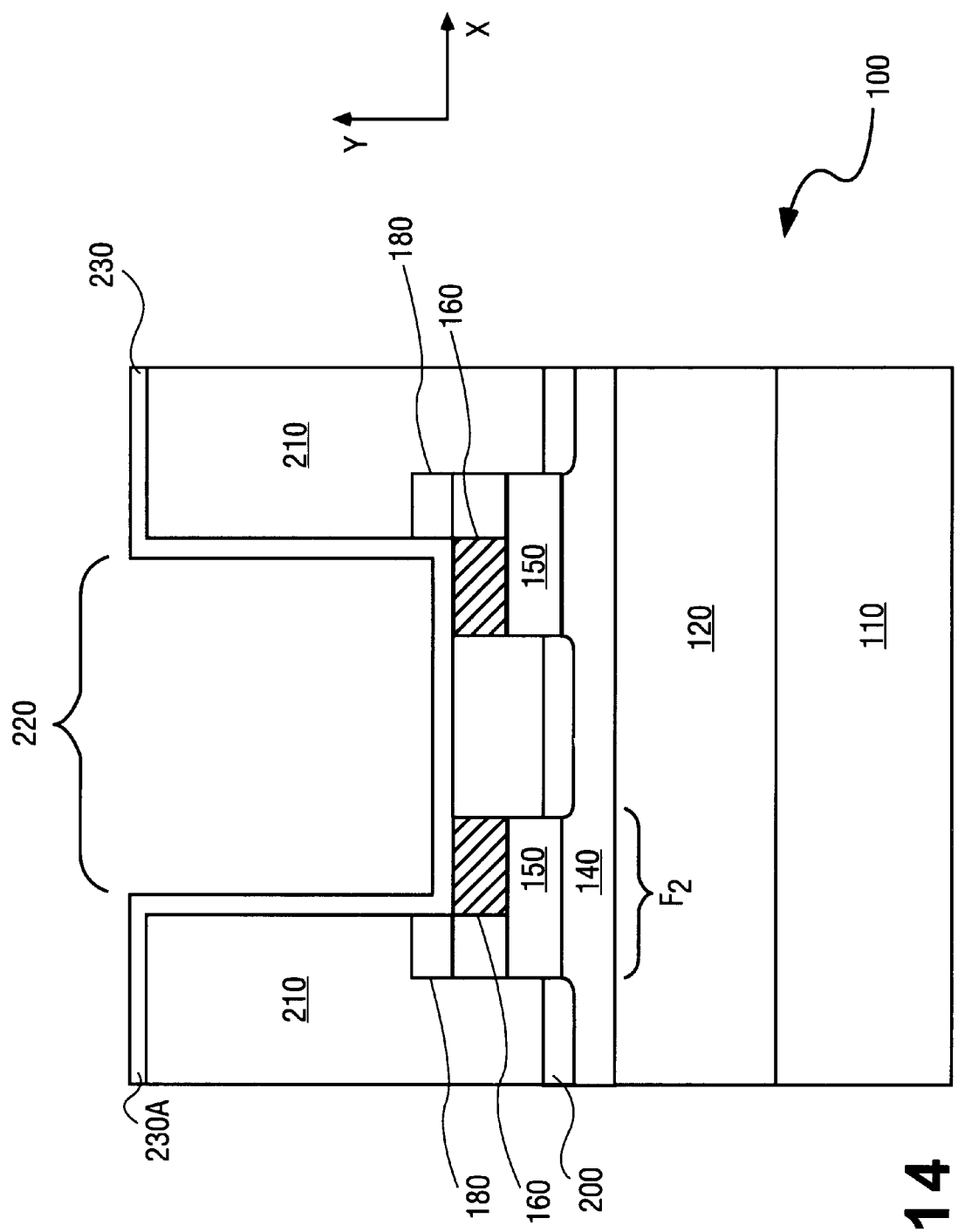
FIG. 14 illustrates the structure of FIG. 9 after further processing to achieve a redneck double-wide trench that spans two future gate stacks.

FIG. 14 illustrates further processing of the structure depicted in FIG. 9 according to this embodiment. A conductive film 230 is formed in recess 220, although in this embodiment, recess 220 spans two diode stacks in the x-direction is the stack feature, $F_2$ definition has been carried out and preferably spans at least two diode stacks in the z-direction. Typically, the z-direction will be a trench that spans a row or a column length.

In one embodiment, the conductive film is a polysilicon film 230. The conformal introduction of polysilicon film 230 may follow conventional introduction techniques known to those skilled in the art including chemical vapor deposition (CVD) techniques. In the example shown, a suitable dopant is a P-typed dopant such as boron introduced to a concentration on the order of about $10^{19}$–$10^{20}$ atoms/cm$^3$.

Figure 15:
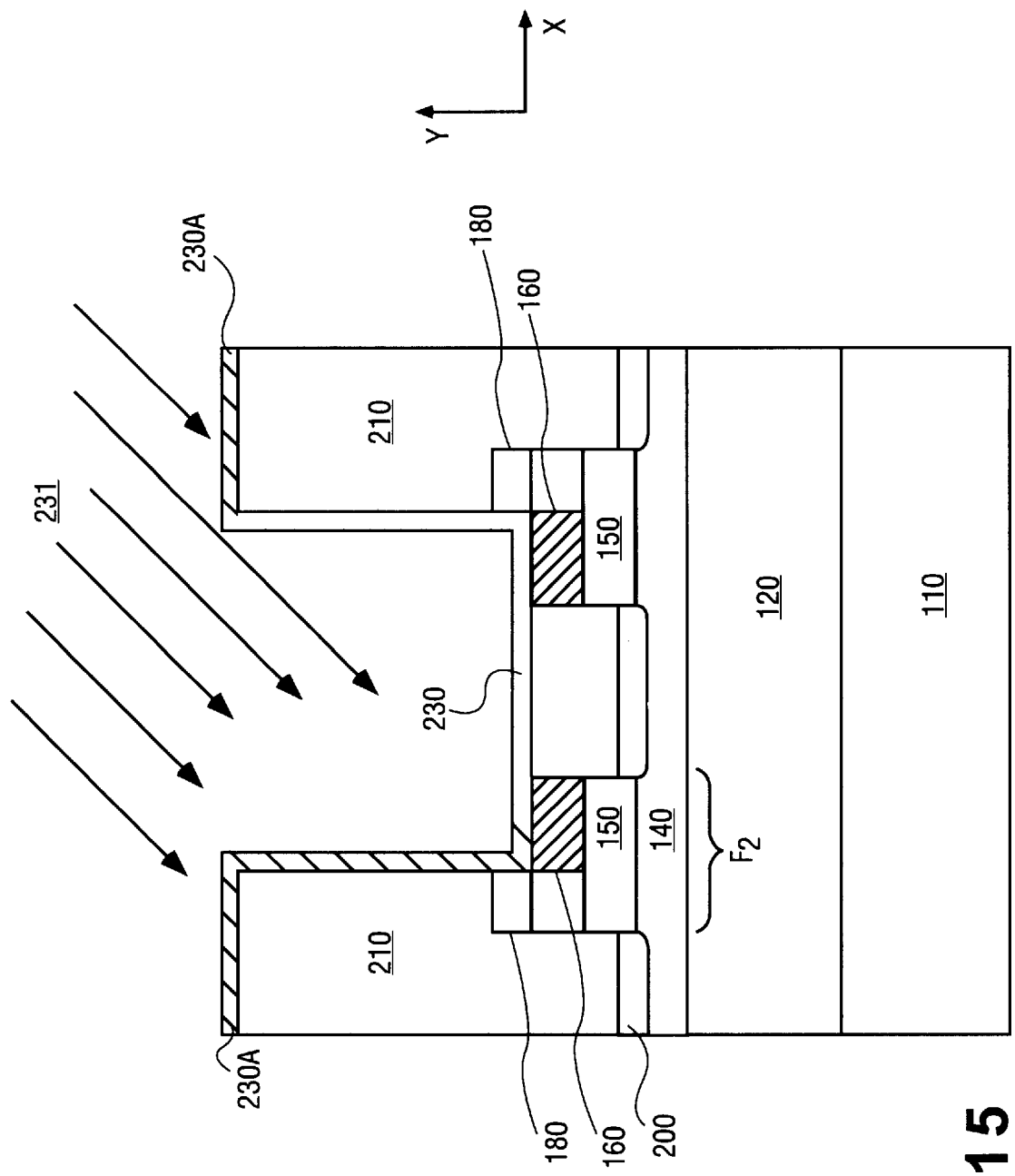
FIG. 15 shows the structure during first angled doping that makes one portion of the lower electrode material conductive, but leaves a portion of the electrode material undoped at the bottom.

Following the formation of recess 220 in substrate 100, and following forming the polysilicon film 230, polysilicon film 230 is treated to further prepare the memory device. FIG. 15 illustrates a first portion of treating, wherein a first implantation 231 is carried out. The angle of implantation leaves the first degree of conductivity of polysilicon film 230 at the bottom of recess 220 in the region between the diode stacks. The first degree of conductivity is substantially dielectric as is characteristic of undoped polysilicon. The angle of implantation also leaves a second degree of conductivity of the first implanted polysilicon film 230A that is electrically conductive after thermal processing and that may be referred to as lower electrode 230A.

Figure 16:
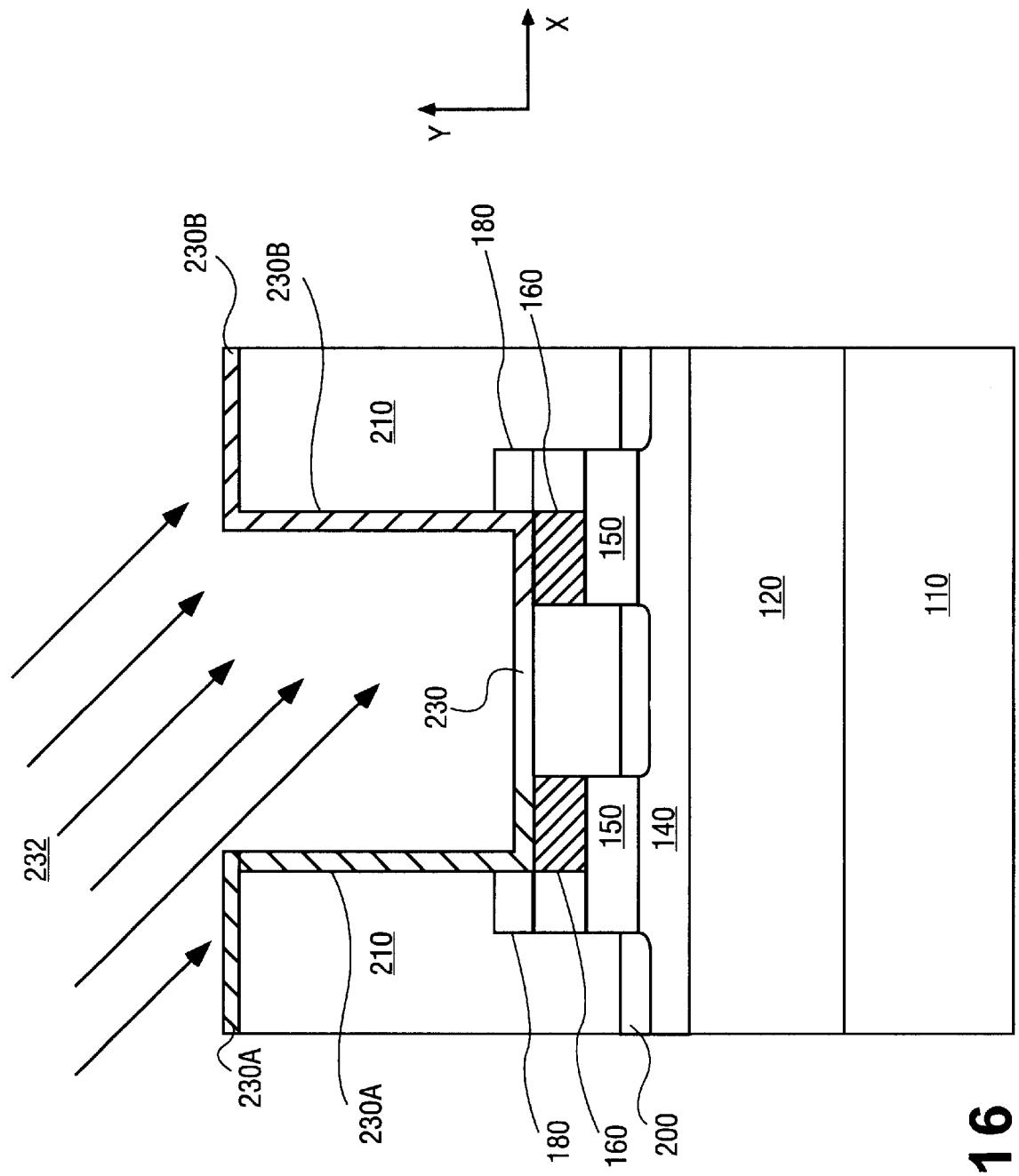
FIG. 16 shows the structure during second angled doping that impinges the opposite side of the electrode material in the recess that also leaves the same portion of the electrode material undoped at the bottom.

FIG. 16 illustrates a second portion of treating, wherein a second implantation 232 is carried out. The angle of implantation again leaves the first degree of conductivity of polysilicon film 230 at the bottom of recess 220 in the region between the diode stacks and the second degree of conductivity of the second implanted polysilicon film 230B and that may be referred to as lower electrode 230B. After second implantation 232, the second conductivity may be understood to be substantially the same for both the lower electrode 230A and the lower electrode 230B By "substantially the same," it is meant that as an array of memory elements, operation of the array will not need to address inexact doping differences, if any are detectable.

The angled implantation or angled doping may be further treated by an activation process such as a thermal treatment that causes the doping materials to alter electrical conductivity. A dopant is introduced into the polycrystalline silicon film 230 to, in one aspect, lower the resistance of the material.

Figure 17:
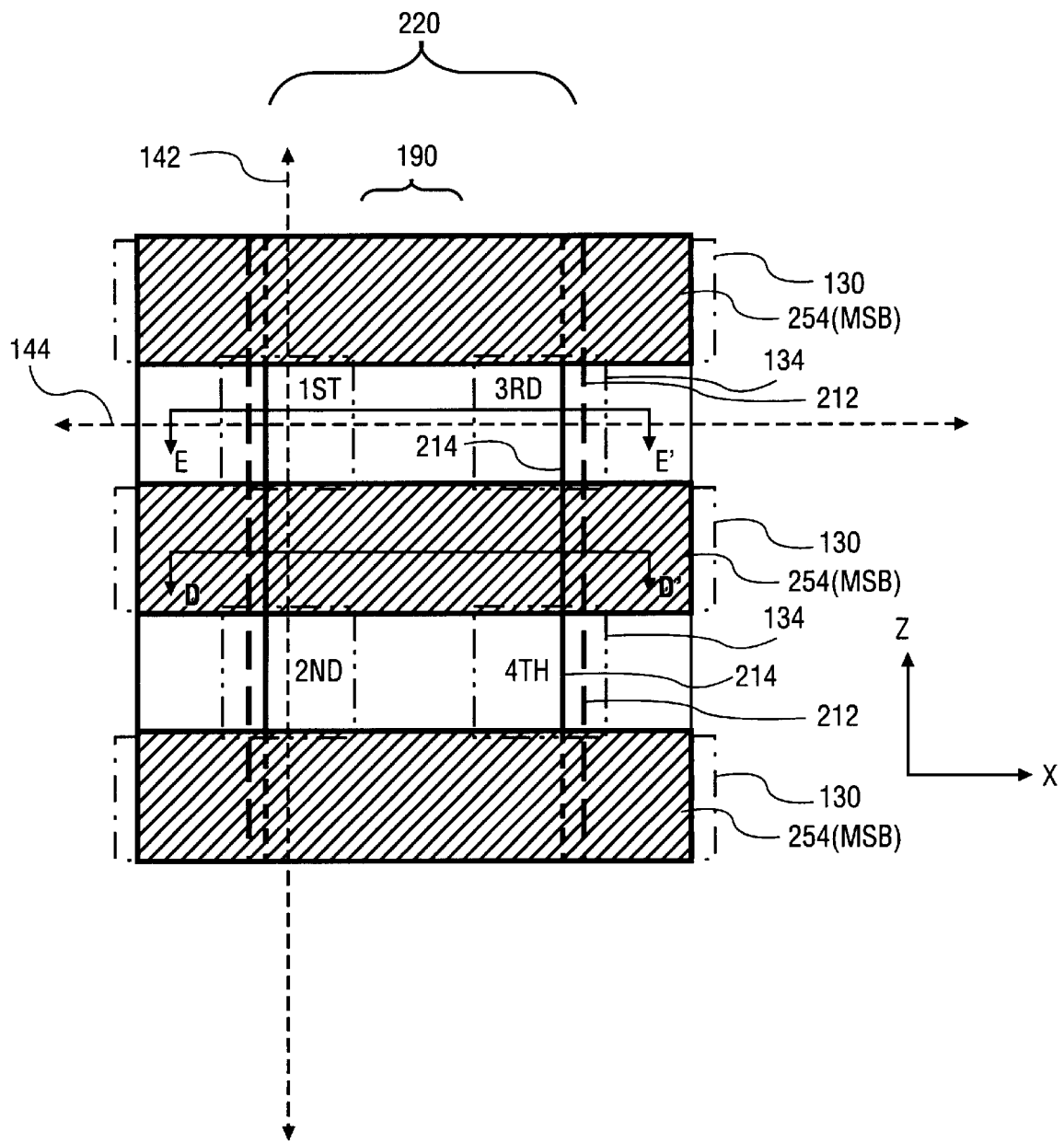
FIG. 17 is a top plan view of the structure that illustrates selective doping if elected.

FIG. 17 illustrates the substrate in a top plan view of the x-z layout. The first and second active areas are configured along a first symmetry line 142. The first and third active areas are configured along a second symmetry line 144. First isolation structure 130 defines spaced-apart $1^{st}$ and $2^{nd}$ areas. Trench 190 defines spaced-apart $1^{st}$ and $3^{rd}$ areas. The second symmetry line 144 also delineates the transverse axis across recess 220 when recess 220 is a trench. The first symmetry line 142 also runs parallel with the longitudinal axis along recess 220 when recess 220 is a trench.

In one embodiment of the present invention, an etch must be carried out to singulate the polysilicon film 230 into discrete strips in the Z-direction which is in the direction parallel to the trench shape of recess 220. This embodiment is carried out according to known process parameters. Typically, the singulation process for polysilicon film 230 may be referred to as a litho/etch process (MSK).

FIG. 17 illustrates masking that is opposite that needed to singulate polysilicon film 230 in an anisotropic etch such as MSK. Alternatively, the angled doping of polysilicon film may be carried out with mask 254 in place to form what may be termed a matchstick block (MSB) process. In this alternative, mask 254 and temporary material 252 (FIG. 18) are stripped and an etch recipe may be used that is selective to the doped areas, such that the undoped areas are removed in the etch. Etch recipes that are selective to doped areas are known in the art.

FIG. 17 illustrates the substrate in a top plan view, wherein subsurface structures are depicted in phantom lines. FIG. 17 illustrates dielectric structure 130 and trench 190 if present. Both dielectric structure 130 and trench 190 are depicted as being disposed beneath the surface. FIGS. 16 and 17 also illustrate the inner wall 212 of dielectric material 210 and the inner surface 214 of polysilicon film 230 that forms a polysilicon wall.

Figure 18:
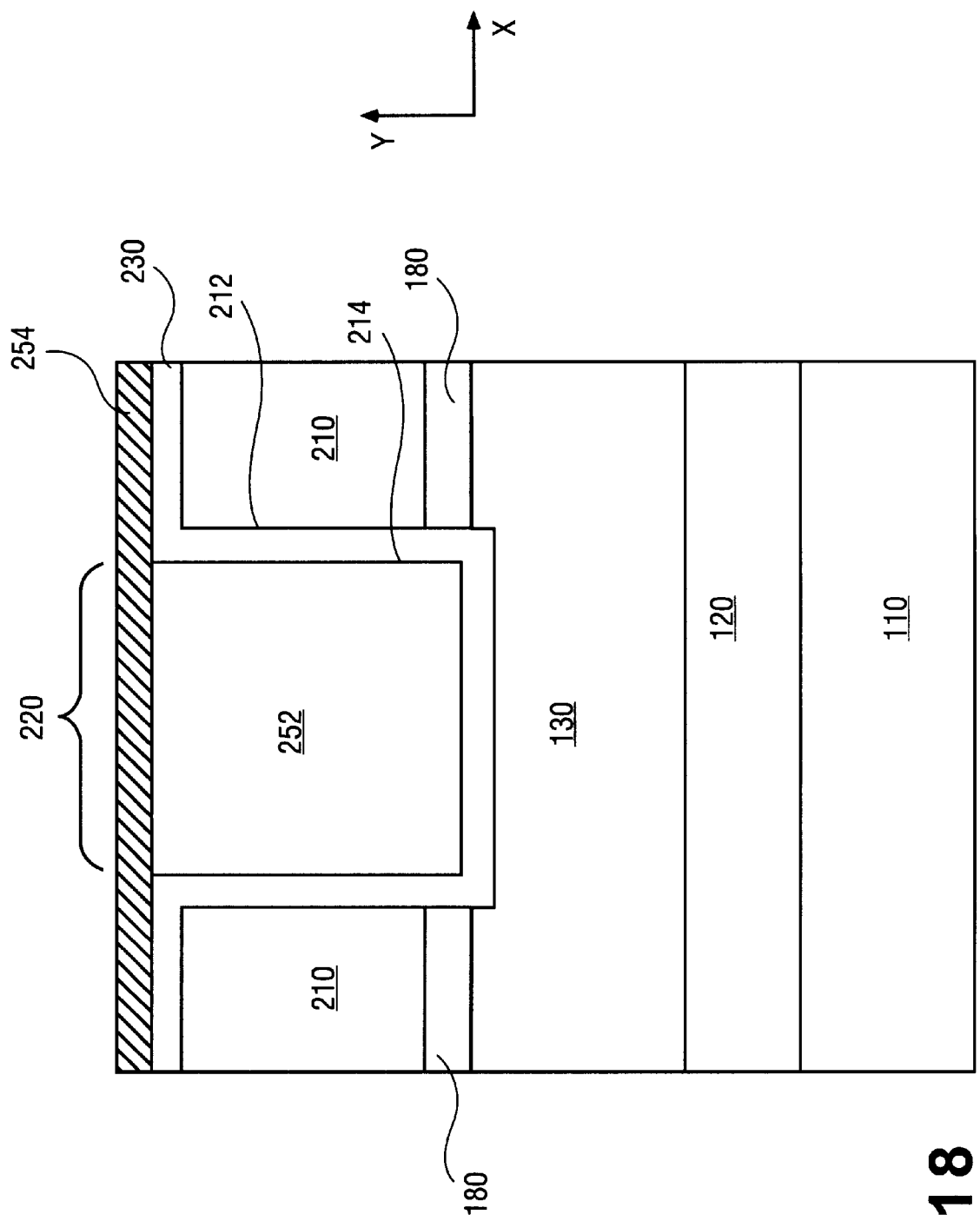
FIG. 18 is an elevational cross-section view of the structure in FIG. 17, taken along the line D–D'.

FIG. 18 is an elevational cross-section view of the substrate depicted in FIG. 17, along the section line D–D'. FIG. 18 illustrates another embodiment of the present invention in which the MSK process is supplanted with the MSB process. The MSB process eliminates the need for a polysilicon etch and the impact of the polysilicon etch upon the diode stack or upon its virtual stack counterpart as depicted in FIG. 10*a*. Because of the doping scheme provided in the present invention, a double-wide trench with a polysilicon film disposed therein will form isolated discrete sections of conductivity, and by a process flow that is simplified over an etch process flow to remove nonconducting polysilicon.

In this embodiment, a temporary material 252 is patterned with the assistance of a mask 254 and both first and second angled doping, as set forth above, follow the patterning of temporary material 252. Because polysilicon film 230 is undoped due to the presence of temporary material 252, and because of the undoped region that remains at the bottom of trench 220, the doped sections of polysilicon film form discrete isolated regions of electrically conductive material of the second conductivity type. According to this embodiment, polysilicon film 230 is substantially unsingulated, but the inventive doping process has formed discrete isolated regions of electrical conductivity. Each discrete isolated region is in electrical contact with an active area as will be further illustrated.

FIG. 19 is an elevational cross-section view of the substrate depicted in FIG. 16, after extensive further processing. After implanting polysilicon film to form polysilicon film 230A and 230B, and thermal activation to form lower electrodes 230A and 230B, recess 220 is filled with a second dielectric 250. Second dielectric 250 may be formed by chemical vapor deposition of a silicon-containing substance selected from silicon oxide such a tetra ethyl ortho silicate (TEOS) process and the like. Following the formation of second dielectric 250, all material that resides above the top level 240 of recess 220 is removed as illustrated in FIG. 19. Removal of material may be accomplished by processes such as chemical mechanical planarization (CMP), mechanical planarization, and the like. Removal of material may be accomplished by processes such as isotropic etchback, anisotropic etchback, and the like.

Similar to the process flow depicted in FIG. 13, a modifying species may be introduced into lower electrode 230A and 230B. Referring to FIG. 19, a modifying species is introduced into electrode material 230A and 230B to form modified electrode materials 270A and 270B. FIG. 19 shows the structure having an electrode of two different material portions: electrode material 230A and 230B (e.g., doped polycrystalline silicon) and first modified electrode material 270A and 270B (e.g., polycrystalline silicon and SiC, $SiO_2$, etc.). Modified electrode material 270A and 270B is introduced into a portion of the electrode adjacent the exposed surface of the electrode at and near upper level 240.

Alternatively, one embodiment of the present invention relates to a salicide structure at the bottom of the via, but no salicide structures at the diode stack emitters after a manner depicted in FIG. 13*a*. As depicted in FIG. 13*a*, the alternative process is carried out such that, after a self-aligned N+ implantation 360 of the base region at the bottom of the via, a salicidation process is carried out to form an N+ salicide structure 362.

The structure shown in FIG. 19 also shows additional conductor or signal line material 320 similar to the process flow depicted in FIG. 13*a*.

FIG. 20 presents a graphical representation of the setting and resetting of a volume of phase change memory material. Referring to FIG. 1, setting and resetting memory element 15 (addressed by column line 10*a* and row line 20*a*) involves, in one example, supplying a voltage to column line 10*a* to introduce a current into the volume of memory material 30 as illustrated in FIG. 1 or memory material 290 as illustrated in FIG. 12. The current causes a temperature increase at the volume of memory material 30. Referring to FIG. 20, to amorphize a volume of memory material, the volume of memory material is heated to a temperature beyond the amorphisizing temperature, $T_M$. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. The inset of FIG. 20 shows memory cell 15 having an electrode with modified portion 35 (illustrated as a resistor) to concentrate heat (current) at the volume of memory material 30.

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An embedded phase-change memory array comprising:

spaced apart first and second active areas that are disposed in a substrate;

a CMOS logic structure that is peripheral to the memory array, wherein the CMOS logic structure comprises self-aligned silicide structures disposed over and above doped active areas;

a recess comprising a bottom and walls, wherein the recess communicates to the first active area and the second active area; and a polysilicon film disposed in the recess, wherein the polysilicon film has a first conductivity at the bottom and a second conductivity at the walls.

2. The embedded phase-change memory array according to claim 1, wherein the first and second active areas are spaced apart along a first symmetry line, further comprising:

a third active area that is spaced apart from the first active area along a second symmetry line that is orthogonal to the first symmetry line, wherein the polysilicon film is continuous between the first active area and the second active area.

3. The embedded phase-change memory array according to claim 1, further comprising:

a first isolation structure that is disposed in the substrate parallel to the second symmetry line.

4. The embedded phase-change memory array according to claim 1, further comprising:

a first isolation structure that is disposed in the substrate parallel to the second symmetry line; and a trench that is disposed in the substrate orthogonal to the first isolation structure.

5. An apparatus comprising:

a dedicated memory chip including a plurality of first address lines and a plurality of second address lines on a substrate, addressing circuitry coupled to the plurality of first address lines and the plurality of second address lines, a plurality of memory cells formed between respective ones of the plurality of first address lines and the plurality of second address lines each memory cell including a spaced apart first active area and second active area disposed in the substrate and a recess in the substrate including a bottom and walls, a CMOS logic structure that is peripheral to the plurality of memory cells, and a polysilicon film disposed in the recess, wherein the polysilicon film has a first conductivity at the bottom and a second conductivity at the walls, wherein the CMOS logic structure includes self-aligned silicide structures disposed over and above doped active areas, wherein the recess communicates to the first active area and the second active area.

6. The apparatus according to claim 5, wherein the first and second active areas are spaced apart along a first symmetry line, each memory cell further including a third active area in the substrate that is spaced apart from first active area along a second symmetry line that is orthogonal to the first symmetry line, wherein the polysilicon film is continuous between the first active area and the second active area.

7. The apparatus according to claim 6, wherein each memory cell further includes a first isolation structure that is disposed in the substrate parallel to the second symmetry line.

8. The apparatus according to claim 7, wherein each memory cell further includes a trench that is disposed in the substrate orthogonal to the first isolation structure.

* * * * *